United States Patent
Shibasaki

(10) Patent No.: US 8,698,528 B2
(45) Date of Patent: Apr. 15, 2014

(54) CDR CIRCUIT, RECEPTION CIRCUIT, AND ELECTRONIC DEVICE

(75) Inventor: Takayuki Shibasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/617,922

(22) Filed: Sep. 14, 2012

(65) Prior Publication Data
US 2013/0169328 A1  Jul. 4, 2013

(30) Foreign Application Priority Data
Dec. 28, 2011  (JP) .................................. 2011-289873

(51) Int. Cl.
*H03L 7/06* (2006.01)
(52) U.S. Cl.
USPC ............................. 327/158; 327/156; 327/236
(58) Field of Classification Search
USPC ......................................... 327/156, 158, 236
See application file for complete search history.

(56) References Cited

U.S. PATENT DOCUMENTS
2010/0289544 A1* 11/2010 Lee et al. ....................... 327/159

FOREIGN PATENT DOCUMENTS
JP    02-111130 A    4/1990
JP    2002-300142 A  10/2002

* cited by examiner

*Primary Examiner* — John Poos
(74) *Attorney, Agent, or Firm* — Arent Fox LLP

(57) ABSTRACT

An apparatus includes an integration circuit that integrates values of one of a data center and a data edge of input data, based on clock signals, a sampling circuit that samples another at the data center and a data edge of the input data, based on clock signals, a first determination circuit that determines a data value of an integration value of the integration circuit, a second determination circuit that determines a data value of a sampling value of the sampling circuit, a phase detection circuit that detects phase information of the input data, based on a data value determined by the first determination circuit and the second determination circuit, and a phase adjusting circuit that adjusts a phase of a reference clock so as to track a phase of the input data, in accordance with the phase information, so as to output as the clock signals.

7 Claims, 19 Drawing Sheets

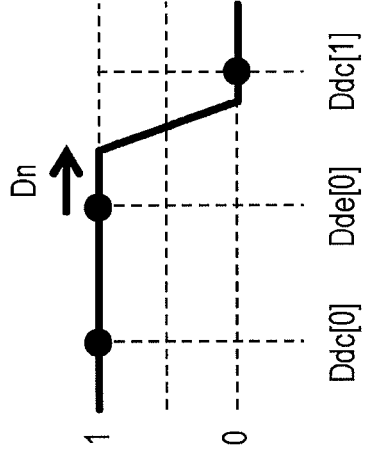
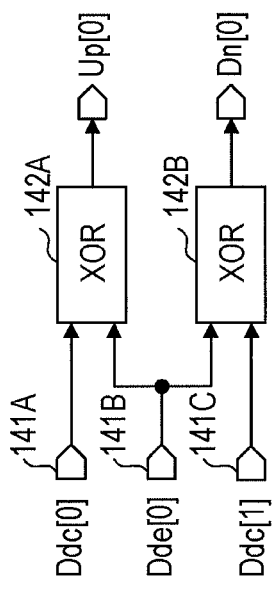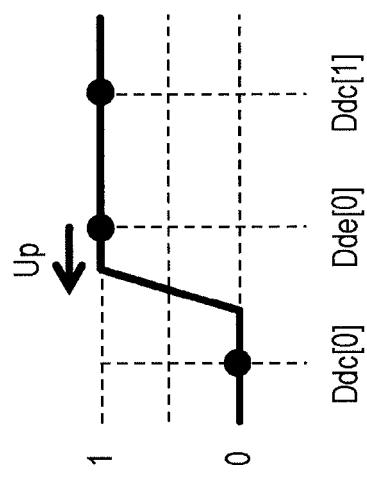

CDR CIRCUIT, RECEPTION CIRCUIT, AND ELECTRONIC DEVICE

CROSS-REFERENCE TO RELATED APPLICATION

This application is based upon and claims the benefit of priority of the prior Japanese Patent Application No. 2011-289873, filed on Dec. 28, 2011, the entire contents of which are incorporated herein by reference.

FIELD

The embodiments discussed herein are related to a CDR circuit, a reception circuit, and an electronic device.

BACKGROUND

There have conventionally been CDR (Clock and Data Recovery) circuits which perform sampling of reception data, by synchronizing the phase of clock signals with the phase of reception data, so as to recover the data and clock.

Examples of CDR circuits include a 1x type CDR circuit which performs sampling of each bit of received data once, and a 2x type CDR circuit which performs sampling of each bit of received data twice.

Japanese Laid-open Patent Publication Nos. 2002-300142 and 2-111130 discuss the above related art.

Now, with conventional CDR circuits, multiple clock signals with different phases are used to perform sampling twice or more on each bit of received data.

Generating multiple clock signals with different phases has a problem in that the circuit becomes complex, and electric power consumed by the circuit increases.

Thus, there is a problem with conventional CDR circuits in that it is difficult to raise the sampling rate without increasing the number of clock signals.

SUMMARY

According to an aspect of the embodiments, an apparatus includes an integration circuit that integrates values of one of a data center and a data edge of input data, based on clock signals, a sampling circuit that samples another at the data center and a data edge of the input data, based on clock signals, a first determination circuit that determines a data value of an integration value of the integration circuit, a second determination circuit that determines a data value of a sampling value of the sampling circuit, a phase detection circuit that detects phase information of the input data, based on a data value determined by the first determination circuit and the second determination circuit, and a phase adjusting circuit that adjusts a phase of a reference clock so as to track a phase of the input data, in accordance with the phase information, so as to output as the clock signals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 12A through 12D are diagrams for describing output of XOR circuits of the phase detection circuit of the CDR circuit according to the first embodiment.

DESCRIPTION OF EMBODIMENTS

Hereinafter, description will be made of an embodiment of a CDR circuit, reception circuit, and an electronic device, applied to an embodiment.

Before describing the CDR circuit according to the embodiment, first, problems with the CDR circuits of the first and second comparative examples will be described with reference to FIGS. 1 through 4.

First Comparative Example

Figure 1:
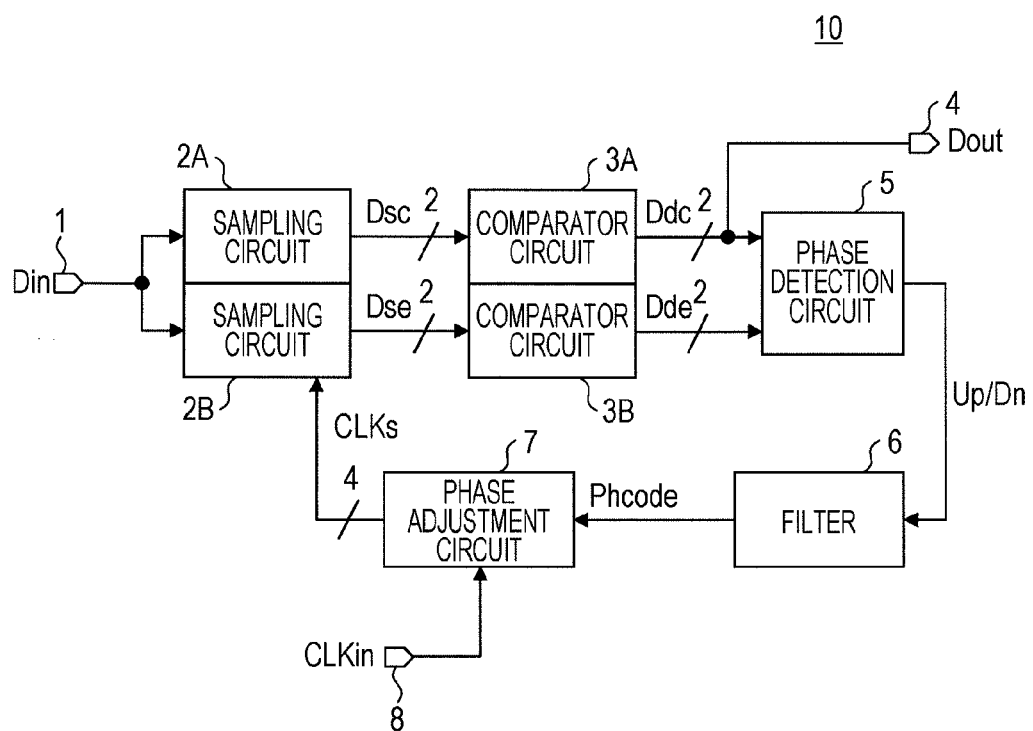
FIG. 1 is a diagram illustrating a CDR circuit according to a first comparative example.

FIG. 1 is a diagram illustrating a CDR circuit according to the first comparative example.

A CDR circuit 10 according to the first comparative example is a 2x type CDR circuit, and includes a data input terminal 1 sampling circuits 2A and 2B, comparator circuits 3A and 3B, a data output terminal 4, a phase detection circuit 5, a filter 6, a phase adjuster circuit 7, and a clock input terminal 8.

The CDR circuit 10 is disposed within an IC (Integrated Circuit) chip mounted to a backplane within a server for example, and is a circuit which recovers data and clock signals of received data received via the backplane from another IC chip mounted to the same back plane.

The data input terminal 1 is a terminal which inputs received data Din received from another IC chip via the backplane to the CDR circuit 10.

The sampling circuits 2A and 2B are connected to the data input terminal 1 in parallel, and are each circuits to sample a data center value Dsc and data edge Dse of received data Din. The comparator circuits 3A and 3B are connected to the output sides of the sampling circuits 2A and 2B, respectively.

The sampling circuits 2A and 2B output the data center value Dsc and data edge value Dse of received data Din each as interleaved format data.

The comparator circuits 3A and 3B are each connected to the output sides of the sampling circuits 2A and 2B. The output side of the comparator circuit 3A is connected to the data output terminal 4 and one input terminal of the phase detection circuit 5. The output side of the comparator circuit 3B is connected to the other input terminal of the phase detection circuit 5.

The comparator circuits 3A and 3B each compare data center value Dsc and data edge Dse of received data Din, output from the sampling circuits 2A and 2B with a given threshold value. The comparator circuits 3A and 3B each determine which value of 1 and 0 the data center value Dsc and data edge Dse of received data Din are, and output data Ddc and Dde representing the determination results (1 or 0).

The comparator circuits 3A and 3B output the data Ddc and Dde representing the determination results (1 or 0) as interleaved format data.

The data output terminal 4 outputs the data Ddc output from the comparator circuit 3A as output data Dout of the CDR circuit 10. The output data Dout is interleaved format data.

The phase detection circuit 5 detects the phase of received data Din form the data Ddc and Dde input from the comparator circuits 3A and 3B, outputs a down signal Dn in the event that the phase of a sampling clock CLKs is ahead of the received data Din, and outputs an up signal Up in the event that the phase of the sampling clock CLKs is behind.

The filter 6 generates phase code Phcode from the up signal Up or down signal Dn input from the phase detection circuit 5, and inputs this to the phase adjuster circuit 7.

The phase adjuster circuit 7 adjusts the phase of a reference clock CLKin such that the phase of the reference clock CLKin tracks the phase of the received data Din, and outputs this as the sampling clock CLKs, based on phase code input from the filter 6.

The sampling clock CLKs is a block signal having phase difference of 0 degrees/180 degrees, 45 degrees/225 degrees, 90 degrees/270 degrees, and 135 degrees/315 degrees, as to the reference clock CLKin, and is used as four differential clocks, of a differential clock of a pair of 0 degrees and 180 degrees, a differential clock of a pair of 45 degrees and 225 degrees, a differential clock of a pair of 90 degrees and 270 degrees, and a differential clock of a pair of 135 degrees and 315 degrees.

The clock input terminal 8 is a terminal to which the reference clock CLKin, serving as a reference clock, is input from a PLL (Phase Locked Loop) circuit or the like that is not illustrated.

Now, the phase adjuster circuit 7 of the CDR circuit 10 according to the first comparative example will be described with reference to FIG. 2.

Figure 2:
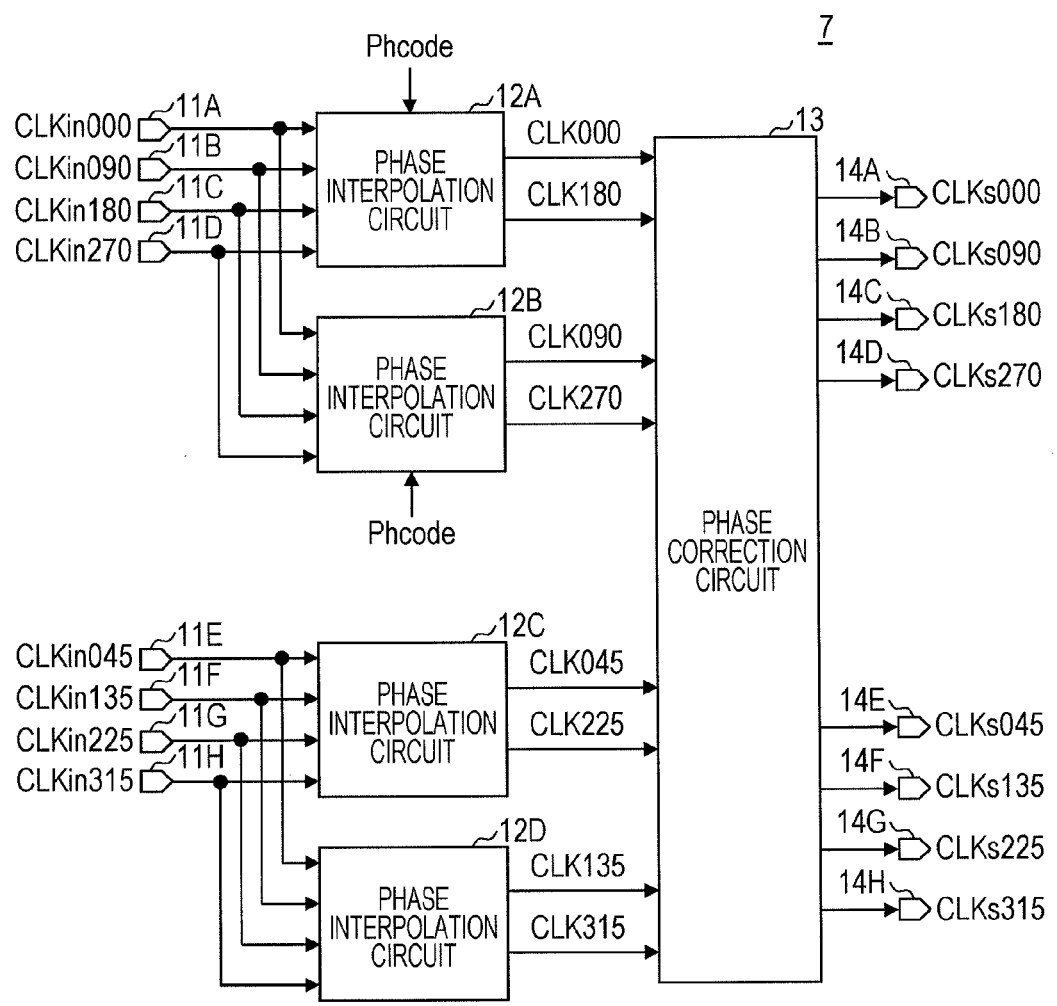
FIG. 2 is a diagram illustrating a circuit configuration of a phase adjuster circuit of a CDR circuit according to the first comparative example.

FIG. 2 is a diagram illustrating the circuit configuration of the phase adjuster circuit 7 of the CDR circuit 10 according to the first comparative example.

The phase adjuster circuit 7 has input terminals 11A through 11H, phase interpolation circuits 12A through 12D, a phase correction circuit 13, and output terminals 14A through 14H.

The input terminals 11A through 11D are input with CLKin000, CLKin090, CLKin180, and CLKin270 which have phases differing by 90 degrees each, and the output sides are each connected to the phase interpolation circuits 12A and 12B.

Input to the inter terminals 11A through 11D are the reference clocks CLKin000, CLKin090, CLKin180, and CLKin270 from a PLL circuit of the like that is not illustrated. The reference clocks CLKin000, CLKin090, CLKin180, and CLKin270 are each input to the phase interpolation circuits 12A and 12B.

Based on phase code Phcode input from the filter 6, the phase interpolation circuits 12A and 12B perform interpolation of the phases of the reference clocks CLKin000, CLKin090, CLKin180, and CLKin270, so as to track the phase of the received data Din.

The interpolation circuits 12A and 12B add the reference clocks CLKin000, CLKin090, CLKin180, and CLKin270 with different phases, thereby generating clocks with phases between the reference clocks. The ratio of the reference clocks CLKin000, CLKin090, CLKin180, and CLKin270 when being added is adjusted by the phase code, thereby generating clocks CLK000, CLK090, CLK180, and CLK270 of desired phases.

The CLK000, CLK090, CLK180, and CLK270, of which the phase has been corrected with the phase interpolation circuits 12A and 12B are input to the phase correction circuit 13, where correction of skew and the like, for example, is performed.

The input terminals 11E through 11H are input with clocks CLKin045, CLKin135, CLKin225, and CLKin315 which have phases differing by 90 degrees each, and the output sides are each connected to the phase interpolation circuits 12C and 12D. The clocks CLKin045, CLKin135, CLKin225, and CLKin315 input to the input terminals 11E through 11H differ from the CLK000, CLK090, CLK180, and CLK270 input to the input terminals 11A through 11D by 45 degrees each.

Input to the inter terminals 11E through 11H are the reference clocks CLKin045, CLKin135, CLKin225, and CLKin315 from a PLL circuit of the like that is not illustrated. The reference clocks CLKin045, CLKin135, CLKin225, and CLKin315 are each input to the phase interpolation circuits 12C and 12D.

Based on phase code Phcode input from the filter 6, the phase interpolation circuits 12C and 12D perform interpolation of the phases of the reference clocks CLKin045, CLKin135, CLKin225, and CLKin315, so as to track the phase of the received data Din.

The CLK045, CLK135, CLK225, and CLK315, of which the phase has been corrected with the phase interpolation circuits 12C and 12D are input to the phase correction circuit 13, where correction of skew and the like, for example, is performed.

Thus, the phase adjuster circuit 7 handles the eight types of clocks CLK000, CLK045, CLK090, CLK135, CLK180, CLK225, CLK270, and CLK315, dividing one clock cycle by 45-degree intervals.

The clocks CLK000 through CLK315 are eight types of clocks obtained by dividing one cycle of the clock CLK000 in 45-degree intervals, and since a 45-degree interval is relatively narrow, it is demanded thereof to be highly precise clocks.

Accordingly, the phase adjuster circuit 7 corrects skew in the phase of the clocks CLK000 through CLK315 with the phase correction circuit 13, so as to maintain high precision of the eight types of clocks CLK000 through CLK315.

The CLK000, CLK090, CLK180, and CLK270 subjected to correction at the phase correction circuit 13 are output via output terminals 13A through 13D as sampling clocks CLKs000, CLKs090, CLKs180, and CLKs270.

The sampling clocks CLKs000, CLKs090, CLKs180, and CLKs270 include two sets of differential clocks, which are a differential clock of the set of sampling clocks CLKs000 and CLKs180, and a differential clock of the set of sampling clocks CLKs090 and CLKs270.

The differential clock of the set of sampling clocks CLKs000 and CLKs180 and the differential clock of the set of sampling clocks CLKs090 and CLKs270 differ in phase by 90 degrees from each other.

The clocks CLK045, CLK135, CLK225, and CLK315 subjected to correction at the phase correction circuit 13 are output via output terminals 13E through 13H as sampling clocks CLKs045, CLKs135, CLKs225, and CLKs315.

The sampling clocks CLKs045, CLKs135, CLKs225, and CLKs315 include two sets of differential clocks, which are a differential clock of the set of sampling clocks CLKs045 and CLKs225, and a differential clock of the set of sampling clocks CLKs135 and CLKs315.

The differential clock of the set of sampling clocks CLKs045 and CLKs225 and the differential clock of the set of sampling clocks CLKs135 and CLKs315 differ in phase by 90 degrees from each other.

The phase adjuster circuit 7 outputs the four sets of differential clocks, of the differential clock of sampling clocks CLKs000 and CLKs180, the differential clock of CLKs045 and CLKs225, the differential clock of CLKs090 and CLKs270, and the differential clock of CLKs135 and CLKs315, in an interleaved format.

The CDR circuit 10 may perform sampling twice on each bit of received data, by using the four sets of differential clocks output in an interleaved format as described above.

Second Comparative Example

Next, a CDR circuit 20 according to a second comparative example will be described with reference to FIG. 3.

Figure 3:
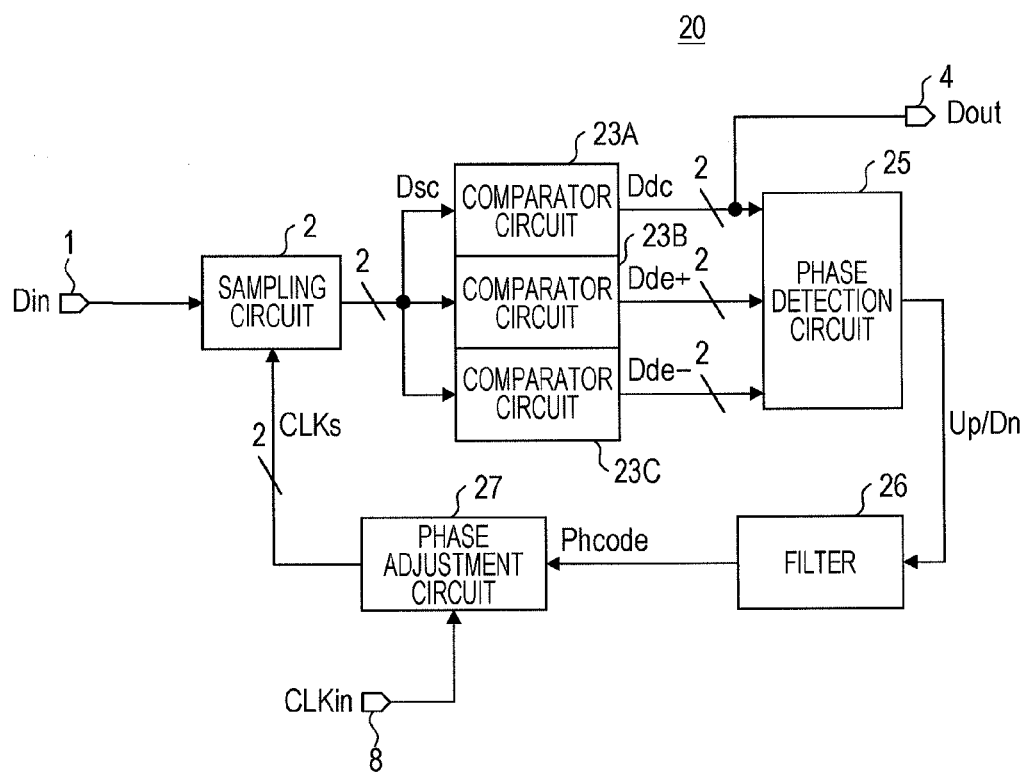
FIG. 3 is a diagram illustrating a CDR circuit of a second comparative example.

FIG. 3 is a diagram illustrating the CDR circuit according to the second comparative example.

The CDR circuit 20 according to the second comparative example is a 1x type CDR circuit, and includes a data input terminal 1, a sampling circuit 2, comparator circuits 23A through 23C, a data output terminal 4, a phase detection circuit 25, a filter 26, a phase adjuster circuit 27, and a clock input terminal 8.

In the same way as with the CDR circuit 10 in the first comparative example, the CDR circuit 20 is disposed within an IC chip mounted to a backplane within a server for example, and is a circuit which recovers data and clock signals of received data received via the backplane from another IC chip mounted to the same back plane.

Hereinafter, the same components as with those of the CDR circuit 10 in the first comparative example will be denoted with the same reference numeral, and description thereof will be omitted.

The sampling circuit 2 is a circuit which samples the data center value Dsc of the received data input to the data input terminal 1. Connected to the output side of the sampling circuit 2 are the comparator circuits 23A through 23C, and the sampling circuit 2 outputs the data center value Dsc in an interleaved format.

The comparator circuits 23A through 23C are each connected to the outputs side of the sampling circuit 2. The output side of the comparator circuit 23A is connected to the data output terminal 4 and to one of the three input terminals of the phase detection circuit 25. The output sides of the comparator circuits 23B and 23C are each connected to the remaining two of the three input terminals of the phase detection circuit 25.

The comparator circuits 23A through 23C each compare data center value Dsc of the received data Din output from the sampling circuit 2 with a given threshold value. The comparator circuits 23A through 23C have different reference values. The reference value of the comparator circuit 23A is an intermediate value of the three reference value, with the reference value of the comparator circuit 23B being a reference value that is greater than the reference value of the comparator circuit 23A, and the reference value of the comparator circuit 23C being a reference value that is smaller than the reference value of the comparator circuit 23A.

The comparator circuits 23A through 23C each determine compare the data center value Dsc of the received data Din with the reference value and determined whether the data value is 1 or 0, and data Ddc, Dde+, or Dde− representing the determination result (1 or 0) is output in an interleaved format.

The phase detection circuit 25 detects the phase of the received data Din from the Ddc, Dde+, or Dde− input from the comparator circuits 23A through 23C, and outputs a down signal Dn in the event that the phase of a sampling clock CLKs is ahead of the received data Din, to delay the phase. Also, the phase detection circuit 25 outputs an up signal Up in the event that the phase of the sampling clock CLKs is behind the received data Din, to advance the phase.

The filter 6 generates phase code Phcode from the up signal Up or down signal Dn input from the phase detection circuit 25, and inputs this to the phase adjuster circuit 27.

The phase adjuster circuit 27 adjusts the phase of a reference clock CLKin based on phase code Phcode input from the filter 6, and outputs this as the sampling clock CLKs. The sampling clock CLKs is an interleaved format differential clock having 90-degree phase difference.

The sampling clock CLKs output from the phase adjuster circuit 27 is a clock signal where the phase of the reference clock CLKin is caused to track the phase of the received data Din.

Now, the phase adjuster circuit 27 of the CDR circuit 20 according to the second comparative example will be described with reference to FIG. 4.

Figure 4:
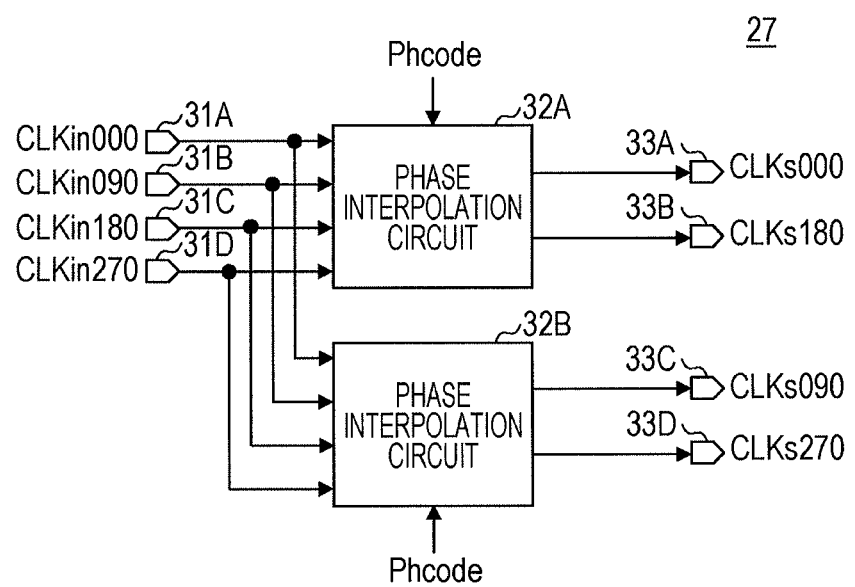
FIG. 4 is a diagram illustrating a circuit configuration of a phase adjuster circuit of a CDR circuit according to the second comparative example.

FIG. 4 is a diagram illustrating the circuit configuration of the phase adjusting circuit 27 of the CDR circuit 20 according to the second comparative example.

The phase adjuster circuit 27 includes input terminals 31A through 31D, phase interpolation circuits 32A and 32B, and output terminals 33A through 33D.

The input terminals 31A through 31D are input with clocks CLKin000, CLKin090, CLKin180, and CLKin270 which have phases differing by 90 degrees each, with the output sides thereof being connected to the phase interpolation circuits 32A and 32B.

Input to the input terminals 31A through 31D are the reference clocks CLKin000, CLKin090, CLKin180, and CLKin270 from a PLL circuit of the like that is not illustrated. The reference clocks CLKin000, CLKin090, CLKin180, and CLKin270 are each input to the phase interpolation circuits 32A and 32B.

Based on phase code Phcode input from the filter 6, the phase interpoiation circuit 32A performs interpolation of the phases of the reference clocks CLKin000, CLKin090, CLKin180, and CLKin270, so as to track the phase of the received data Din, and outputs reference clocks CLKin000 and CLKin180.

Based on phase code Phcode input from the filter 6, the phase interpolation circuit 32B performs interpolation of the phases of the reference clocks CLKin000, CLKin090, CLKin180, and CLKin270, so as to track the phase of the received data Din, and outputs reference clocks CLKin090 and CLKin270.

The CLKin000, CLKin090, CLKin180, and CLKin270 regarding which the phases have been interpolated at the phase interpolation circuits 32A and 32B are output via the output terminals 33A through 33D as sampling clocks CLKs000 CLKs090, CLKs180, and CLKs270.

The sampling clocks CLKs000 and CLKs180 are one set of differential clocks, and the sampling clocks CLKs090 and CLKs270 are another set of differential clocks. These two sets of differential clocks are output from the output terminals 33A through 33D with interleaved format having a phase differing by 90 degrees from each other.

By using the two sets of differential clocks output with the interleaved format such as described above, the CDR circuit 20 according to the second comparative example may perform one sampling for each bit of received data Din.

As described above, the CDR circuit 10 according to the first comparative example is a 2x type CDR circuit, and the CDR circuit 20 according to the second comparative example is a 1x type CDR circuit.

The 2x type CDR circuit 10 uses the four differential clocks output in interleaved format at the phase adjuster circuit 7, so the circuit is greater as compared with the phase adjuster circuit 27 of the 1x type CDR circuit 20, and uses more electric power as well.

This is because the phase adjuster circuit 7 illustrated in FIG. 2 has to have four phase interpolation circuits 12A through 12D, whereas the phase adjuster circuit 27 illustrated in FIG. 4 only has to have two phase interpolation circuits 32A and 32B.

Also, the phase adjuster circuit 7 in the first comparative example performs correction of skewing and so forth, due to outputting four sets of differential clocks output at 45-degree interval phase differences in interleaved format. The phase adjuster circuit 7 also includes the phase correction circuit 13, further leading to increased power consumption and larger circuit scale as compared with the phase adjuster circuit 27 according to the second comparative example.

Thus, the 2x type CDR circuit 10 according to the first comparative example may double the number of times of sampling which may be performed on each bit of received data Din as compared to the 1x type CDR circuit 20 according to the second comparative example.

On the other hand, while the 1x type CDR circuit 20 according to the second comparative example realizes a simplified circuit configuration, this fall short of the 2x type CDR circuit 10 according to the first comparative example in that phase tracking capabilities are low.

Accordingly, the embodiments discussed below aim to provide a CDR circuit and electronic device solving the above problems.

The following is a description of a CDR circuit, reception circuit, and electronic de vice, according to first through third embodiments.

First Embodiment

Figure 5:
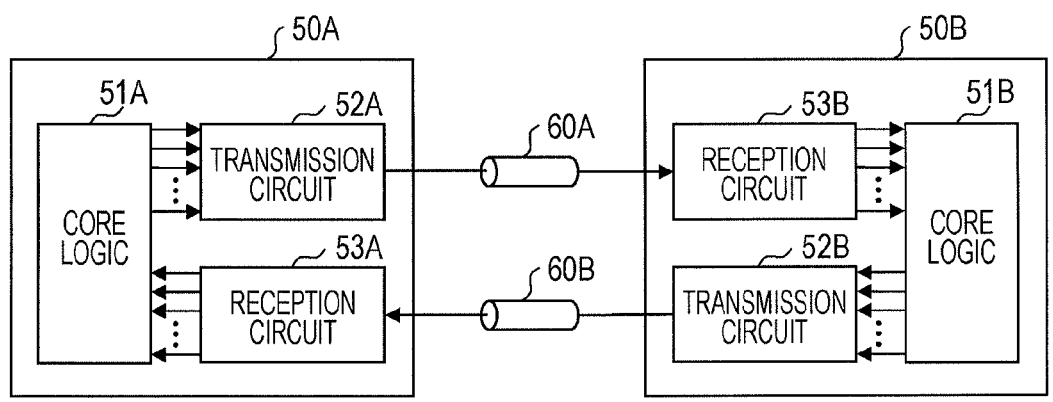
FIG. 5 is a diagram illustrating a reception circuit and electronic device including a CDR circuit according to a first embodiment.

FIG. 5 is a diagram illustrating IC (Integrated Circuit) chips including a CDR circuit according to the first embodiment.

IC chips 50A and 50B illustrated in FIG. 5 are connected via transmission paths 60A and 60B. The transmission paths 60A and 60B schematically represent wiring of a backplane where the IC chips 50A and 50B are mounted, for example.

The IC chip 50A includes a core logic 51A, transmission circuit 52A, and reception circuit 53A. In the same way, the IC chip 50B includes a core logic 51B, transmission circuit 52B, and reception circuit 53B. Note that the IC chips 50A and 50B are an example of an electronic device that includes the CDR circuit according to the first embodiment.

The core logics 51$a$ and 51B are cores each including a CPU (Central Processing Unit).

The transmission path 52A is connected at the input side thereof to the core logic 51A, and the output side is connected to the reception circuit 53B of the IC chip 50B via the transmission path 60A. The reception circuit 53A is connected at the output side thereof to the core logic 51A, and the input side is connected to the transmission circuit 52B of the IC chip 50B via the transmission path 60B.

The transmission path 52B is connected at the input side thereof to the core logic 51B, and the output side is connected to the reception circuit 53A of the IC chip 50A via the transmission path 60B. The reception circuit 53B is connected at the output side thereof to the core logic 51B, and the input side is connected to the transmission circuit 52A of the IC chip 50A via the transmission path 60A.

In a case of transmitting data between the IC chips 50A and 50B via the transmission paths 60A and 60B such as a backplane or the like, and particularly in a case where the transmission speed (transmission rate) is high or the transmission paths 60A and 60B are long, the waveform of the data deteriorates.

Accordingly, the IC chips 50A and 50B according to the first embodiment include CDR (Clock and Data Recovery) circuits within the reception circuits 53A and 53B which receive data, to recover the clock and data of the received data.

Note that while description will be made here regarding a form where the CDR circuit according to the first embodiment is included in the reception circuits 53A and 53B, it is sufficient for a circuit including the CDR circuit according to the first embodiment to be a circuit which recovers data and clocks, and is not restricted to the reception circuits 53A and 53B.

Next, the CDR circuit according to the first embodiment will be described.

Figure 6:
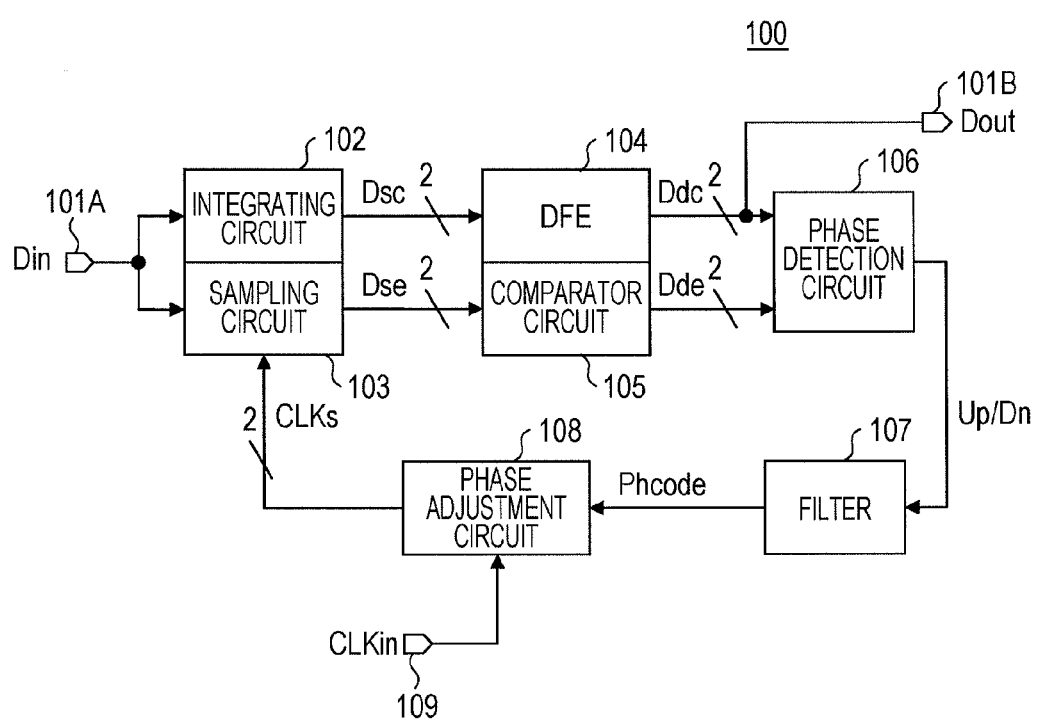
FIG. 6 is a diagram illustrating a CDR circuit according to the first embodiment.

FIG. 6 is a diagram illustrating the CDR circuit according to the first embodiment.

A CDR circuit 100 according to the first embodiment includes a data input terminal 101A, a data output terminal 101B, an integration circuit 102, a sampling circuit 103, a DFE (Decision Feedback Equalizer) 104, a comparator circuit 105, a phase detection circuit 106, a filter 107, a phase adjuster circuit 108, and a clock input terminal 109.

The CDR circuit 100 is disposed within each of the reception circuits 53A and 53B of the IC chips 50A and 50B, and is a circuit which performs recovery of data and clock signals of the received data Din received via the transmission paths 60A and 60B. The received data Din is an example of input data to the CDR circuit 100.

The CDR circuit 100 according to the first embodiment performs interleaving operations in accordance with the sampling clock CLKs in an interleaved format.

The data input terminal 101A is a terminal which inputs, to the CDR circuit 100, the received data Din received from the other IC chip (50A or 50B) via the transmission paths 60A and 60B (see FIG. 5).

The integration circuit 102 has the input side connected to the data input terminal 101A and the output side connected to the DFE 104. The integration circuit 102 integrates and outputs the data center value Dsc of the received data Din input from the data input terminal 101A, based on the sampling clock CLKs input from the phase adjuster circuit 108. Note that the CDR circuit 100 according to the first embodiment performs interleaving operations, so actually two integration circuits 102 are provided.

The sampling circuit 103 is connected to the data input terminal 101A in parallel to the integration circuit 102, and is a circuit which performs sampling of the data edge value Dse of the received data Din. The output side of the sampling circuit 103 is connected to the comparator circuit 105. Note that the CDR circuit 100 according to the first embodiment performs interleaving operations, so actually two sampling circuits 103 are provided.

The DFE 104 has the input side thereof connected to the output side of the integration circuit 102, and the output side thereof is connected to the data output terminal 101B and one input terminal of the phase detection circuit 106. The DFE 104 determines which of 1 or 0 the data value of the data center value Dsc of the received data Din input from the integration circuit 102 is, and outputs data Ddc representing the determining results (1 or 0). The DFE 104 is an example of a first determination circuit. Note that the CDR circuit 100 according to the first embodiment performs interleaving operations, so actually two DFEs 104 are provided.

The comparator circuit 105 is connected to the output side of the sampling circuit 103. The output side of the comparator circuit 105 is connected to the other input terminal of the phase detection circuit 106.

The comparator circuit 105 compares the data edge value Dse of the received data Din output from the sampling circuit 103 with a given threshold value, and determines which data value, of 1 or 0 the data edge value Dse of the received data Din is. The comparator circuit 105 outputs data Dde representing determination result (1 or 0). The comparator circuit 105 is an example of a second determination circuit. Note that the CDR circuit 100 according to the first embodiment performs interleaving operations, so actually two comparator circuits 105 are provided.

The data output terminal 101B outputs the data Ddc output from the DFE 104 as output data Dout of the CDR circuit 100. the data Ddc output from the DFE 104 is a data center value of the received data Din, and is output as the output for the CDR circuit 100 from the data output terminal 101B, since it is a value which represents the data value of the received data Din (1 or 0) itself.

The phase detection circuit 106 detects the phase of the received data Din from the data Ddc and Dde input from the DFE 104 and comparator circuit 105, and in the event that the phase of the sampling clock CLKs is ahead of the received data Din outputs a down signal Dn to delay the phase, and in the event that the phase of the sampling clock CLKs is behind the received data Din outputs an up signal Up to advance the phase. The phase detection circuit 106 is an example of a phase detecting unit.

the filter 107 generates phase code Phcode from the up signal Up or down signal Dn input from the phase detection circuit 106, and inputs this to the phase adjuster circuit 108. This filter 107 includes a low-pass filter for example, and integrates the up signal Up or down signal Dn input from the phase detection circuit 106, and outputs code representing the integrated value as the phase code Phcode.

The phase adjuster circuit 108 adjusts the phase of the reference clock CLKin based on the phase code Phcode input from the filter 107, so that the phase of the reference clock CLKin tracks the phase of the received data Din, and outputs this as a sampling clock CLKs. The phase adjuster circuit 108 is an example of a phase adjusting unit.

The sampling clock CLKs includes clock signals having phase difference of 0 degrees/180 degrees, 90 degrees/270 degrees as to the reference clock CLKin, and is used as a differential clock of a set of 0-degree and 180-degree clock signals and a differential clock of a set of 90-degree and 270-degree clock signals.

The clock input terminal 109 is a terminal to which the reference clock CLKin serving as a reference clock signal, is input from a PLL (Phase Locked Loop) circuit or the like which is not illustrated.

Next, the integration circuit 102 will be described with reference to FIG. 7.

Figure 7:
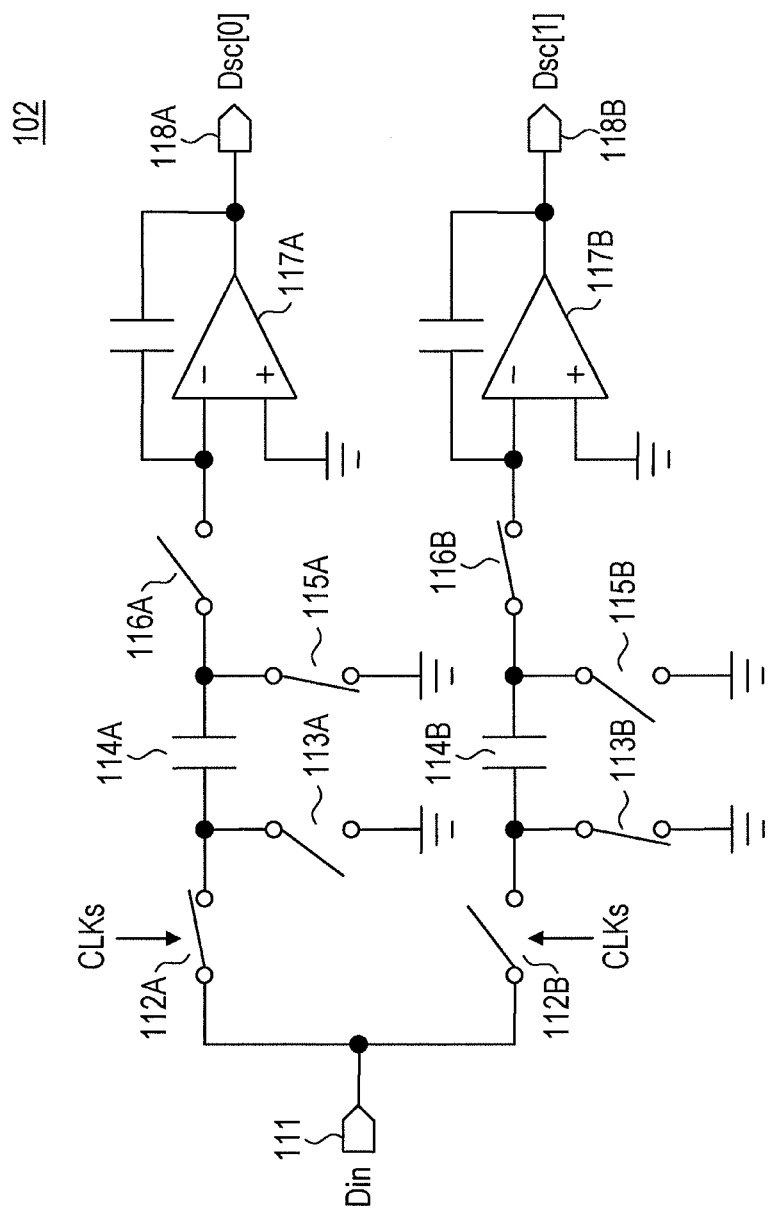
FIG. 7 is a diagram illustrating the circuit configuration of an integration circuit of the CDR circuit according to the first embodiment.

FIG. 7 is a diagram illustrating the circuit configuration of the integration circuit 102 of the CDR circuit 100 according to the first embodiment.

The integration circuit 102 includes a data input terminal 111, switches 112A and 112B, switches 113A and 113B, capacitors 114A and 114B, switches 115a and 115B, switches 116A and 116B, Op-Amps 117A and 117B, and data output terminals 118A and 118B.

The data input terminal 111 is a terminal to which the received data Din from the data input terminal 101A (see FIG. 6) is input. The output side of the data input terminal 111 is connected to one end of the switches 112A and 112B.

The switches 112A and 112B each have one end (the left end terminal in FIG. 7) connected to the data input terminal 111, with one end (upper terminal in FIG. 7) of the switches 113A and 113B and one end of the capacitors 114A and 114B (the left end terminal in FIG. 7) connected to the other end thereof (the right end terminal in FIG. 7). The switches 112A and 112B are alternately switched on/off by the sampling clock CLKs.

The switches 113A and 113B each have one end (upper terminal in FIG. 7) thereof connected to the other end (the right end terminal in FIG. 7) of the switches 112A and 112B and one end of the capacitors 114A and 114B (the left end terminal in FIG. 7), with the other end (lower terminal in FIG. 7) grounded.

The capacitors 114A and 114B each have one end (the left end terminal in FIG. 7) connected to the other end of the switches 112A and 112B (the right end terminal in FIG. 7) and one end (upper terminal in FIG. 7) of the switches 113A and 113B, with the other end connected to one end (upper terminal in FIG. 7) of the switches 115A and 115B and one end (the left end terminal in FIG. 7) of the switches 116A and 116B.

The switches 115A and 115B each have one end (upper terminal in FIG. 7) connected to the other end (the right end terminal in FIG. 7) of the capacitors 114A and 114B and one end (the left end terminal in FIG. 7) of the switches 116A and 116B, and the other end (lower terminal in FIG. 7) grounded.

The switches 116A and 116B each have one end (the left end terminal in FIG. 7) connected to the other end (the right end terminal in FIG. 7) of the capacitors 114A and 114B and one end (upper terminal in FIG. 7) of the switches 115A and 115B, and the other end (the right end terminal in FIG. 7) connected to inverse input terminals of the Op-Amps 117A and 117B.

The Op-Amps 117A and 117B each have the inverse input terminal connected to the other end (the right end terminal in FIG. 7) of the switches 116A and 116B, so that the non-inverse input terminals are grounded, and the output terminals connected to the output terminals 118A and 118B. Negative feedback capacitors are connected between the inverse input terminals of the Op-Amps 117A and 117B and the output terminals.

The data output terminals 118A and 118B are each connected to the output terminals of the Op-Amps 117A and 117B, and output integrated values in interleaved format.

While the switch 112A is turned on by the sampling clock CLKs, the integration circuit 102 turns the switches 113A and 116A off, and turns on the switch 115A, thereby charging the capacitor 114A with received data. This is the integrating operation of the integration circuit 102.

Also, while the switch 112A is turned off by the sampling clock CLKs, the integration circuit 102 turns the switches 113A and 116A on, and turns off the switch 115A, so the charge charged to the capacitor 114A is output from the data output terminal 118A via the Op-Amp 117A as integrated value Dsc[0]. Consequently, integrated value Dsc[0] is output from the integration circuit 102.

The switches 112B, 113B, 115B, and 116B are switched on/off with inverse phase as to the above-described switches 112A, 113A, 115A, and 116A.

Accordingly, the charge charged to the capacitor 114B is output from the data output terminal 118B via the Op-Amp 117B as integrated value Dsc[1]. Consequently, integrated value Dsc[1] is output from the integration circuit 102.

Accordingly, the integrated value Dsc[0] and integrated value Dsc[1] are output from the integration circuit 102 in interleaved format.

Now, the integration of the data center value Dsc of the received data Din from the integration circuit 102 will be described with reference to FIG. 8.

Figure 8:
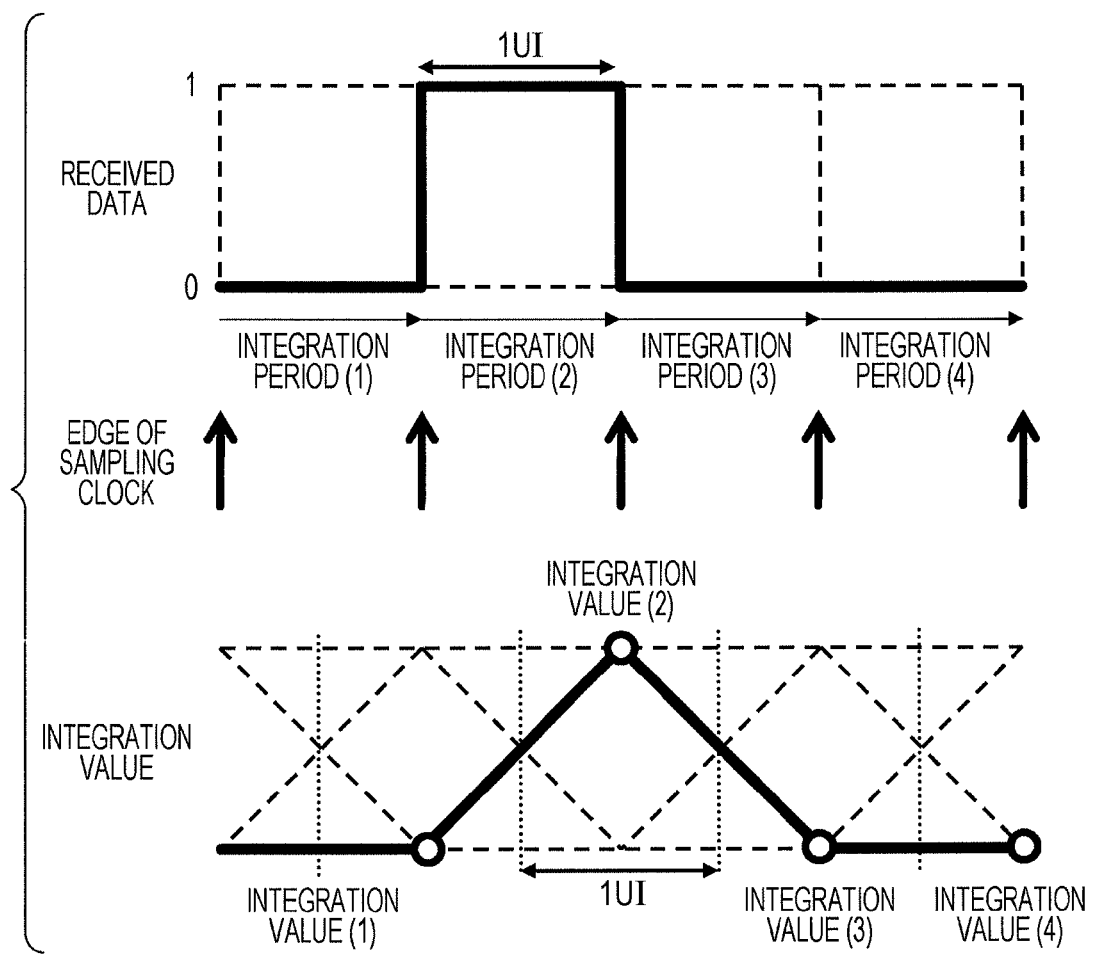
FIG. 8 is a diagram schematically illustrating the relation between reception data, sampling clock edge, and integration value, at the time of the integration circuit of the CDR circuit according to the first embodiment integrating a data center value of received data.

FIG. 8 is a diagram schematically illustrating the relation between reception data, sampling clock edge, and integration value, at the time of the integration circuit 102 of the CDR circuit 100 according to the first embodiment integrating the data center of received data.

For example, we will say that received data Din of 0, 1, 0, 0 (data waveforms in FIG. 8) is input to the integration circuit 102, as indicated by the solid lines in FIG. 8. 1 UI represents a unit interval of the received data Din.

With the first embodiment, the rising of the edge of the sampling clock CLKs is adjusted by the phase adjuster circuit 108 so as to track the received data Din. Note that with the first embodiment, the leading edge of the sampling clock CLKs is used to represent the edge of the sampling clock CLKs, but the trailing edge of the sampling clock CLKs may be used to represent the edge of the sampling clock CLKs.

Accordingly, performing integration over integration periods (1) through (4) between the edges of the sampling clock CLKs with 1 UI as the integration period, the integration value at the integration period (2) where the received data Din is 1 is the center value of 1 UI. This holds true for the integration periods (1), (3), and (4) as well. Note that with the first embodiment, the data center value of the received data Din is integrated at the integration circuit 102, so the integration period is the same as the length of 1 UI of the received data Din.

FIG. 8 illustrates the integration values overlaid on the eye pattern of the received data Din, but the integration values are obtained as data center values of 1 UI of the received data Din.

With the first embodiment, the data center value of the received data Din is integrated at the integration circuit 102, as illustrated in FIG. 8.

Next, the sampling circuit 103 will be described with reference to FIG. 9.

Figure 9:
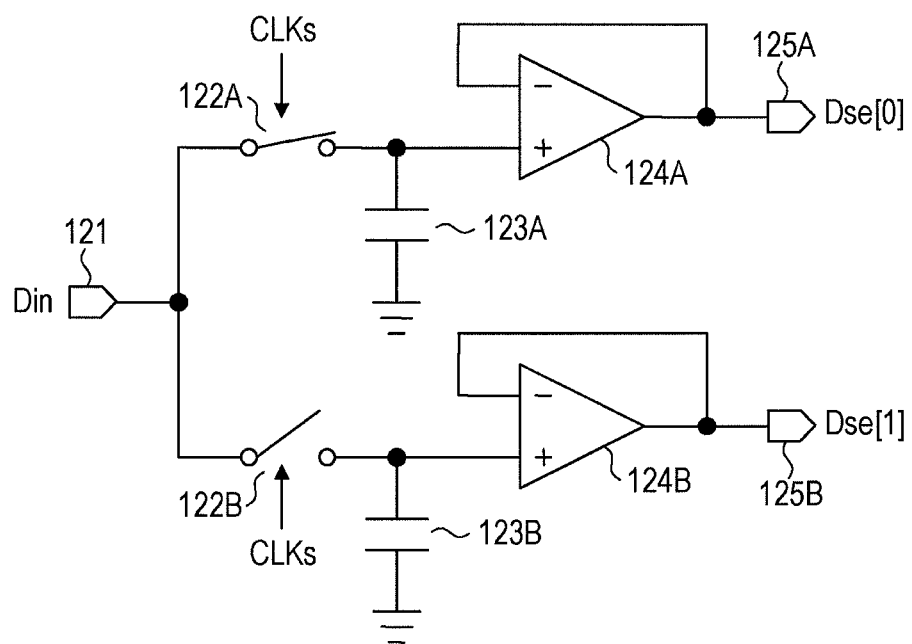
FIG. 9 is a diagram illustrating the circuit configuration of a sampling circuit of the CDR circuit according to the first embodiment.

FIG. 9 is a diagram illustrating the circuit configuration of the sampling circuit 103 of the CDR circuit 100 according to the first embodiment.

The sampling circuit 103 includes a data input terminal 121, switches 122A and 122B, capacitors 123A and 123B, Op-Amps 124A and 124B, and data output terminals 125A and 125B.

The data input terminal 121 is a terminal to which the received data Din from the data input terminal 101A (see FIG. 6) is input. The output side of the data input terminal 121 is connected to one end (the left end terminal in FIG. 9) of the switches 122A and 122B.

The switches 122A and 122B each have one end (the left end terminal in FIG. 9) connected to the data input terminal 121, and have the other end (the right end terminal in FIG. 9) connected to one end (upper terminal in FIG. 9) of the capacitors 123A and 123B, and the non-inverse input terminal of the Op-Amps 124A and 124B. The switches 122A and 122B are alternately switched on/off by the sampling clock CLKs.

The capacitors 123A and 123B have one end (upper terminal in FIG. 9) connected to the other end (the right end terminal in FIG. 9) of the switches 122A and 122B and the non-inverse input terminals of the Op-Amps 124A and 124B, and the other end (lower terminal in FIG. 9) grounded.

The Op-Amps 124A and 124B each have the non-inverse input terminal thereof connected to the other end (the right end terminal in FIG. 9) of the switches 122A and 122B and one end (upper terminal in FIG. 9) of the capacitors 123A and 123B, and with the non-inverse input terminals connected to their own output terminals, so that the output terminals are connected to their own inverse input terminals and the data output terminals 125A and 125B.

The data output terminals 125A and 125B are each connected to the output terminals of the Op-Amp 124A and 124B, and the inverse input terminals.

Upon the switch 122A being turned on by the sampling clock CLKs, the received data Din is sampled via the data input terminal 121, thereby changing the capacitor 123A, and the sampling value is output from the data output terminal 125A via the Op-Amp 124A.

The switches 122A and 122B are alternately switched on/off by the sampling clock CLKs, so data representing sampling values is output from the data output terminals 125A and 125B in interleaved format.

Figure 10:
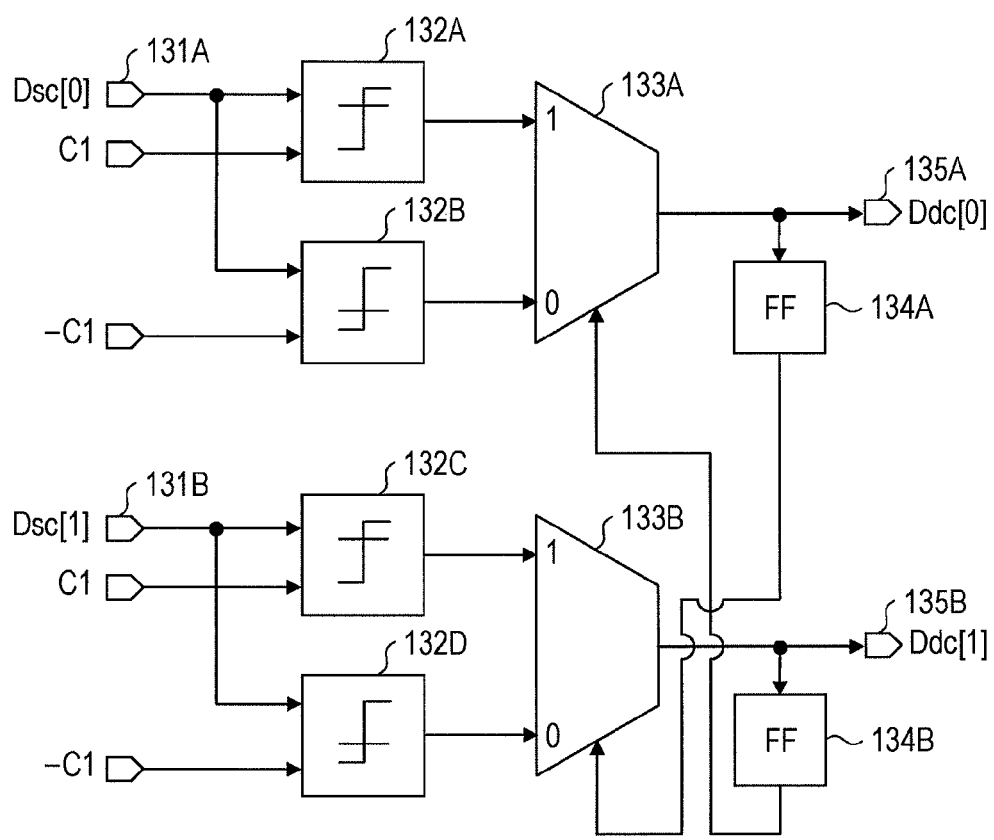
FIG. 10 is a diagram illustrating the circuit configuration of a DFE included in the CDR circuit according to the first embodiment.

FIG. 10 is a diagram illustrating the circuit configuration of the DFE 104 included in the CDR circuit 100 according to the first embodiment.

The DFE 104 includes data input terminals 131A and 131B, comparator circuits 132A through 132D, selectors 133a and 133B, flip-flops 134A and 134B, and data output terminals 135A and 135B.

The data input terminal 131A is connected to the output terminal of the integration circuit 102, and is a terminal where the data center value Dsc[0] of the received data Din is input.

The comparator circuits 132A and 132B each have the input side connected to the data input terminal 131A, so as to compare the data center value Dsc[0] of the received data Din with equivalency coefficients (C1, −C1) serving as threshold values for comparison, and output a value (1 or 0) representing the comparison results.

For example, in the case that the data center value Dsc[0] has an amplitude centered on 0, the comparator circuit 132A outputs 1 if the result of subtracting the equivalency coefficient C1 from the data center value Dsc[0] of the received data Din input from the data input terminal 131A (Dsc[0]−C1) is greater than 0, and outputs 0 if the subtraction result (Dsc[0]−C1) is smaller than 0.

This is equivalent to the comparator circuit 132B outputting 1 if the result of subtracting the equivalency coefficient −C1 from the data center value Dsc[0] of the received data Din input from the data input terminal 131A (Dsc[0]+C1) is greater than 0, and outputting 0 if the subtraction result (Dsc[0]+C1) is smaller than 0.

The selector 133A has the input terminal connected to the output terminals of the comparator circuits 132A and 132B, the selection signal input terminal is connected to the output terminal of the flip-flop 134B, and the output terminal is connected to the input terminal of the flip-flop 134A and the data output terminal 135A.

The selector 133A selects and outputs the output of the comparator circuit 132A in the event that the value of the selection signal input from the flip-flop 134B is 1, and selects and outputs the output of the comparator circuit 132B in the event that the value of the selection signal input from the flip-flop 134B is 0.

The value input to the selection signal input terminal of the selector 133A from the flip-flop 134B is data one bit before the data input to the selector 133A from the comparator circuits 132A or 132B.

The flip-flop 134A has the input side connected to the output terminal of the selector 133A, and the output side connected to the selection signal input terminal of the selector 133B. The flip-flop 134A holds the output of the selector 133A one bit before the data input from the comparator circuits 132C and 132D to the selector 133B.

The data output terminal 135A is a terminal which outputs the output of the selector 133A as a value representing the determination result of the DFE 104, and is connected to the data output terminal 101B and one input terminal of the phase detection circuit 106.

Also, the data input terminal 131B is connected to the output terminal of the integration circuit 102, and is a terminal where the data center value Dsc[1] of the received data Din is input.

The comparator circuits 132C and 132D each have the input side connected to the data input terminal 131B, so as to compare the data center value Dsc[1] of the received data Din with equivalency coefficients (C1, −C1) serving as threshold values for comparison, and output a value (1 or 0) representing the comparison results.

For example, in the case that the data center value Dsc[1] has an amplitude centered on 0, the comparator circuit 132C outputs 1 if the result of subtracting the equivalency coefficient C1 from the data center value Dsc[1] of the received data Din input from the data input terminal 131B (Dsc[1]−C1) is greater than 0, and outputs 0 if the subtraction result (Dsc[1]−C1) is smaller than 0.

This is equivalent to the comparator circuit 132D outputting 1 if the result of subtracting the equivalency coefficient −C1 from the data center value Dsc[1] of the received data Din input from the data input terminal 131B (Dsc[1]+C1) is greater than 0, and outputting 0 if the subtraction result (Dsc[1]+C1) is smaller than 0.

The selector 133B has the input terminal connected to the output terminals of the comparator circuits 132C and 132D, the selection signal input terminal is connected to the output terminal of the flip-flop 134A, and the output terminal is connected to the input terminal of the flip-flop 134B and the data output terminal 135B.

The selector 133B selects and outputs the output of the comparator circuit 132C in the event that the value of the selection signal input from the flip-flop 134A is 1, and selects and outputs the output of the comparator circuit 132D in the event that the value of the selection signal input from the flip-flop 134A is 0.

The value input to the selection signal input terminal of the selector 133B from the flip-flop 134A is data one bit before the data input to the selector 133B from the comparator circuits 132C or 132D.

The flip-flop 134B has the input side connected to the output terminal of the selector 133B, and the output side connected to the selection signal input terminal of the selector 133A. The flip-flop 134B holds the output of the selector 133B one bit before the data input from the comparator circuits 132A and 132B to the selector 133A.

The data output terminal 135B is a terminal which outputs the output of the selector 133B as a value representing the determination result of the DFE 104, and is connected to the data output terminal 101B and one input terminal of the phase detection circuit 106.

Due to the above processing, the DFE 104 performs equalization of the data input from the comparator circuits 132A and 132B.

The DFE 104 determines the data value (1 or 0) for the data center (Dsc[0], Dsc[1]) of the received data Din, and outputs the data Ddc[0] or Ddc[1] representing the determination results from the output terminals 135A and 135B. The value of data Ddc[0] and Ddc[1] is 1 or 0.

The DFE 104 outputs the data Ddc[0] and Ddc[1] from the data output terminals 135A and 135B in interleaved format.

Next, the phase detection circuit 106 of the CDR circuit 100 according to the first embodiment will be described with reference to FIG. 11.

Figure 11:
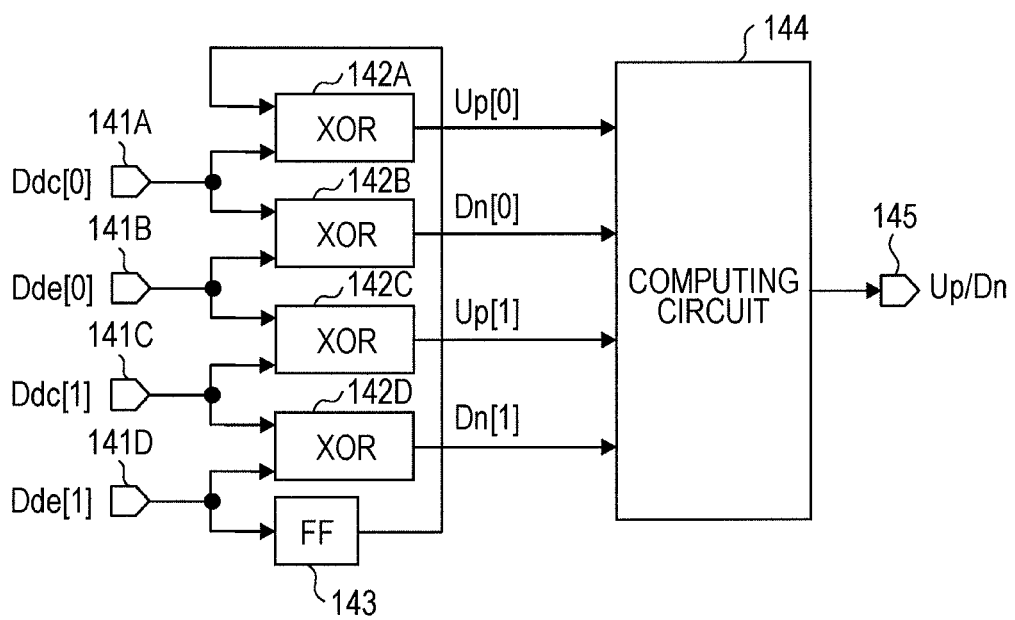
FIG. 11 is a diagram illustrating the circuit configuration of a phase detection circuit of the CDR circuit according to the first embodiment.

FIG. 11 is a diagram illustrating the circuit configuration of the phase detection circuit 106 of the CDR circuit 100 according to the first embodiment.

The phase detection circuit 106 includes data input terminals 141A through 141D, XOR circuits 142A through 142D, a flip-flop 143, a computing circuit 144, and an output terminal 145.

Of the data input terminals 141A through 141D, the data input terminals 141A through 141C are connected to the output terminal of the DFE 104, with data Ddc[0] and Ddc[1] being each input. Also, the data input terminals 141B through 141D are connected to the output terminal of the comparator circuit 105, with data Dde[0] and Dde[1] being each input.

Connected to the output side of the data input terminal 141A is one input terminal of the XOR circuit 142A and one input terminal of the XOR circuit 142B. Connected to the output side of the data input terminal 141B is the other input terminal of the XOR circuit 142B and one input terminal of the XOR circuit 142C.

Connected to the output side of the data input terminal 141C is the other input terminal of the XOR circuit 142C and one input terminal of the XOR circuit 142D. Connected to the output side of the data input terminal 141D is the other input terminal of the XOR circuit 142D and the input terminal of the flip-flop 143.

The XOR circuit 142A has the pair of input terminals connected to the output terminal of the flip-flop 143 and the data input terminal 141A, and the output terminal connected to the input terminal of the computing circuit 144. The XOR circuit 142B has the pair of input terminals connected to the data input terminal 141A and the data input terminal 141B, and the output terminal connected to the input terminal of the computing circuit 144.

The XOR circuit 142C has the pair of input terminals connected to the data input terminal 141B and the data input terminal 141C, and the output terminal connected to the input terminal of the computing circuit 144. The XOR circuit 142D has the pair of input terminals connected to the data input terminal 141C and the data input terminal 141D, and the output terminal connected to the input terminal of the computing circuit 144.

The flip-flop 143 has the input terminal connected to the data input terminal 141D, and the output terminal connected to the other input terminal of the XOR circuit 142A.

The computing circuit 144 has the input side connected to the output terminals of the XOR circuits 142A through 142D, and the output side connected to the output terminal 145.

The output terminal 145 is connected to the output side of the computing circuit 144.

The XOR circuit 142A outputs, as an up signal UP[0], a signal representing the XOR of the output of the flip-flop 143 and the data input from the data input terminal 141A. The XOR circuit 142B outputs, as a down signal Dn[0], a signal representing the XOR of the data input to the data input terminal 141A and the data input to the data input terminal 141B.

The XOR circuit 142C outputs, as an up signal UP[1], a signal representing the XOR of the data input to the data input terminal 141B and the data input to the data input terminal 141C. The XOR circuit 142D outputs, as a down signal Dn[0], a signal representing the XOR of the data input to the data input terminal 141C and the data input to the data input terminal 141D.

Next, the operations of the data input terminals 141A, 141B, 141C, and XOR circuits 142A and 142B, and the output of the XOR circuits 142A and 142B, which are included in the phase detection circuit 106, will be described with reference to FIGS. 12A through 12D.

FIGS. 12A through 12D are diagrams for describing output of XOR circuits 142A and 142B of the phase detection circuit 106 of the CDR circuit 100 according to the first embodiment.

FIG. 12A is a diagram where, of the components of the phase detection circuit 106, the data input terminals 141A, 141B, 141C, and XOR circuits 142A and 142B, are selectively illustrated. FIG. 12B illustrates truth values indicating the relation between the data Ddc[0], Dde[0], and Ddc[1] each input to the data input terminals 141A, 141B, 141C, and the up signal Up or down signal Dn output from the XOR circuits 142A and 142B.

Now, an up signal Up is a signal output to advance the phase in the event that the phase of the sampling clock CLKs is behind that of the received data Din. Also, a down signal Dn is a signal output to delay the phase in the event that the phase of the sampling clock CLKs is ahead that of the received data Din.

Also, in the event that the up signal Up is 1 and the down signal Dn is 0, this indicates a case of advancing the phase of the sampling clock CLKs. On the other hand, in the event that the up signal Up is 0 and the down signal Dn is 1, this indicates a case of delaying the phase of the sampling clock CLKs.

FIG. 12C illustrates an operating example in a case that an up signal Up is output from the XOR circuit 142A in the event of data Ddc[0], Dde[0], and Ddc[1] rising. FIG. 12D illustrates an operating example in a case that a down signal Dn is output from the XOR circuit 142B in the event of data Ddc[0], Dde[0], and Ddc[1] falling.

The XOR circuits 142A and 142B are connected to the data input terminals 141A, 141B, and 141C, as illustrated in FIG. 12A.

Accordingly, as illustrated in the truth value table in FIG. 12B, the cases where the up signal Up is 1 and the down signal Dn is 0 is a case where the data Ddc[0], Dde[0], and Ddc[1] is 0, 1, 1 and a case of 1, 0, 0.

Also, the cases where the up signal Up is 0 and the down signal Dn is 1 is a case where the data Ddc[0], Dde[0], and Ddc[1] is 0, 0, 1 and a case of 1, 1, 0.

For example, as illustrated in FIG. 12C, in the event of rising from data Ddc[0]=0 to Ddc[0]=1, in a case where therebetween the edge data Dde[0]=1, this is equivalent to a case of the phase of the sampling clock CLKs being behind the received data Din. Accordingly, the up signal Up goes to 1 and the down signal Dn goes to 0, to advance the phase of the sampling clock CLKs. This holds true for the case of Ddc[0], Dde[0], and Ddc[1] being 1, 1, 0, as well.

For example, as illustrated in FIG. 12D, in the event of falling from data Ddc[0]=1 to Ddc[0]=0, in a case where therebetween the edge data Dde[0]=1, this is equivalent to a case of the phase of the sampling clock CLKs being ahead of the received data Din. Accordingly, the up signal Up goes to 0 and the down signal Dn goes to 1, to delay the phase of the sampling clock CLKs. This holds true for the case of Ddc[0], Dde[0], and Ddc[1] being 0, 0, 1, as well.

The operations described regarding the data input terminals 141A, 141B, 141C, and XOR circuits 142A and 142B above with reference to FIGS. 12A through 12D are the same for the data input terminals 141A, through 141D and XOR circuits 142A through 142D of the phase detection circuit 106 illustrated in FIG. 11.

The computing circuit 144 of the phase detection circuit 106 illustrated in FIG. 11 decides the degree of up signals Up or down signals Dn ultimately output the output terminal 145 as the operation of the phase detection circuit 106, based on average values of the up signal Up and down signal Dn input from the XOR circuits 142A through 142D, for example.

Next, the phase adjuster circuit 108 of the CDR circuit 100 according to the first embodiment will be described with reference to FIG. 13.

Figure 13:
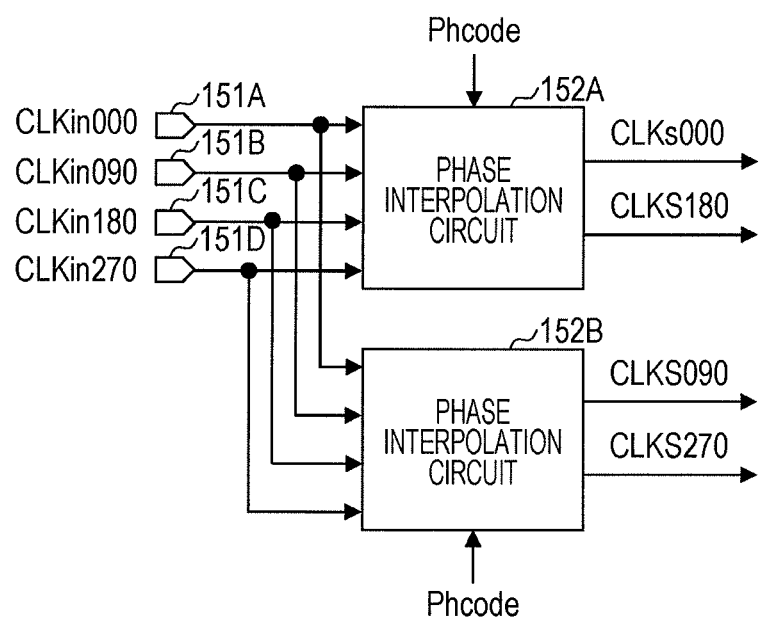
FIG. 13 is a diagram illustrating the circuit configuration of a phase adjuster circuit of the CDR circuit according to the first embodiment.

FIG. 13 is a diagram illustrating the circuit configuration of the phase adjuster circuit 108 of the CDR circuit 100 according to the first embodiment.

The phase adjuster circuit 108 includes input terminals 151A through 151D and phase interpolation circuits 152A through 152D.

The input terminals 151A, 151B, 151C, and 151D are each input with clocks CLKin000, CLKin090, CLKin180, and CLKin270, each having a phase different by 90 degrees, and are each connected to the phase interpolation circuits 152A and 152B.

The input terminals 151A through 151D receive input of the reference clocks CLKin000, CLKin090, CLKin180, and CLKin270 from a PLL circuit or the like not illustrated. The reference clocks CLKin000, CLKin090, CLKin180, and CLKin270 are each input to the phase interpolation circuit 152A and 152B.

The phase interpolation circuit 152A and 152B perform interpolation on the reference clocks CLKin000, CLKin090, CLKin180, and CLKin270, based on the phase code Phcode input from the filter 107, so that the phase tracks the phase of the received data Din.

The phase interpolation circuit 152A generates sampling clocks CLKs000 and CLKs180 by adding the reference clocks CLKin000, CLKin090, CLKin180, and CLKin270 based on the phase code Phcode.

The phase interpolation circuit 152B generates sampling clocks CLKs090 and CLKs270 by adding the reference clocks CLKin000, CLKin090, CLKin180, and CLKin270 based on the phase code Phcode.

The phase interpolation circuits 152A and 152B generate the clocks CLKs000, CLKs0090, CLKs0180, and CLKs270 of the desired phase, by adjusting the ratio of addition of the reference clocks in accordance with the phase code Phcode.

The sampling clocks CLKs000, CLKs0090, CLKs0180, and CLKs270 include two sets of differential clocks, of the differential clock of the set of sampling clocks CLKs000 and CLKs180, and the differential clock of the set of sampling clocks CLKs090 and CLKs270.

The differential clock of the set of sampling clocks CLKs000 and CLKs180, and the differential clock of the set of sampling clocks CLKs090 and CLKs270 have phase difference of 90 degrees from each other.

The phase adjuster circuit 108 outputs a differential format sampling clock of sampling clocks CLKs000 and CLKs180, and a differential format sampling clock of CLKs090 and CLKs270, in interleaved format. That is to say, the phase adjuster circuit 108 outputs two types of differential clocks with different clocks, in interleaved format.

Next, the phase interpolation circuit 152A included in the phase adjuster circuit 108 of the CDR circuit 100 according to the first embodiment will be described with reference to FIG. 14.

Figure 14:
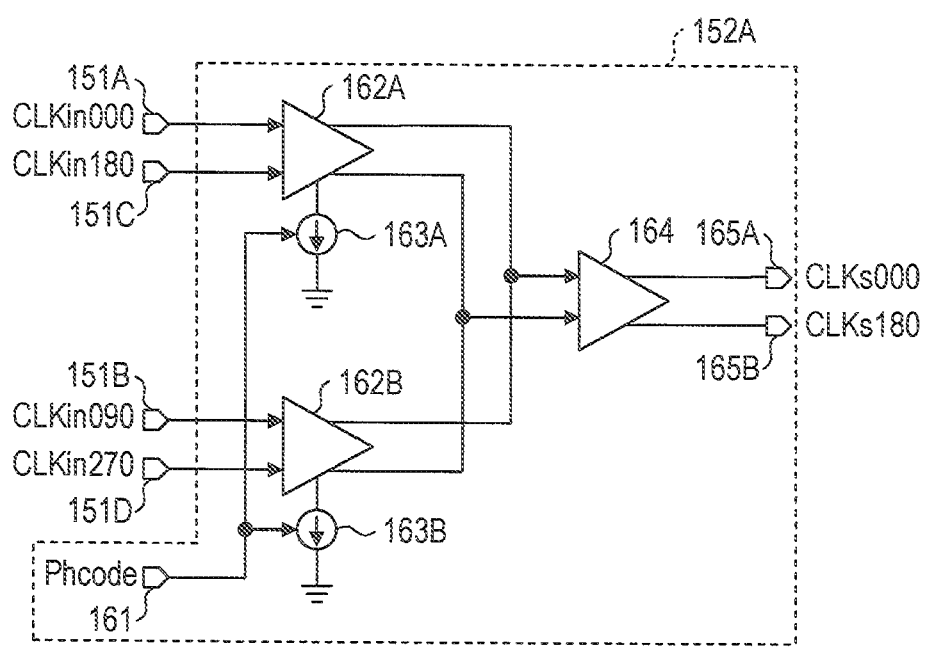
FIG. 14 is a diagram illustrating a phase interpolation circuit included in the phase adjuster circuit included in the CDR circuit according to the first embodiment, and input terminals.

FIG. 14 is a diagram illustrating the phase interpolation circuit 152A included in the phase adjuster circuit 108 of the CDR circuit 100 according to the first embodiment, and input terminals 151A through 151D.

The phase interpolation circuit 152A includes a code input terminal 161 buffers 162A and 162B, power sources 163A and 163B, a buffer 164, and output terminals 165A and 1656.

The code input terminal 161 is a terminal where the phase code Phcode is input from the filter 107 (see FIG. 6).

The buffer 162A has the pair of input terminals connected to the input terminals 151A and 151C, with the reference clocks CLKin000 and CLKin180 being input from the PLL circuit or the like. The buffer 162A has the pair of output terminals connected to the pair of input terminals of the buffer 164, and adjusts the phase of the different clock being output by the current of the power source 163A being controlled.

The buffer 162B has the pair of input terminals connected to the input terminals 151B and 151D, with the reference clocks CLKin090 and CLKin270 being input from the PLL circuit or the like. The buffer 1626 has the pair of output terminals connected to the pair of input terminals of the buffer 164, and adjusts the phase of the different clock being output by the current of the power source 163B being controlled.

The power source 163A performs inversion switching between output phase 0 degrees and 180 degrees, and adjustment of output current, in accordance with the phase code Phcode input from the filter 107 (see FIG. 6) via the code input terminal 161.

The power source 1636 performs inversion switching between output phase 90 degrees and 270 degrees, and adjustment of output current, in accordance with the phase code Phcode input from the filter 107 (see FIG. 6) via the code input terminal 161.

The buffer 164 performs phase interpolation in accordance with the ratio of output current from the buffers 162A and 162B, using the reference clock CLKin000 or CLKin180 input from the buffer 162A, and the reference clock CLKin090 or CLKin270 input from the buffer 162B, and outputs the sampling clock CLKs000.

The buffer 164 also performs phase interpolation in accordance with the ratio of output current from the buffers 162A and 162B, using the reference clock CLKin180 or CLKin000 input from the buffer 162A, and the reference clock CLKin270 or CLKin090 input from the buffer 162B, and outputs the sampling clock CLKs180.

While the phase interpolation circuit 152A has been described here, the phase interpolation circuit 152B has the same circuit configuration as well. The phase interpolation circuit 152B generates sampling clocks CLKs090 and CLKs270.

Thus, according to the first embodiment, the integration circuit 102 integrates the data center value Dsc of the received data Din, so the data center value Dsc of the received data Din may be obtained as an integrated value even without using a sampling clock having an edge at the center of 1 UI of the received data Din.

Also, the data edge value Dse of the received data may be obtained by the sampling circuit 103 which obtains the received data with the edge of the sampling clock.

Accordingly, operation as a 2x type which performs sampling twice on each bit of received data Din may be performed in the same way as with the CDR circuit 10 in the first comparative example, even without using four sets of differential clocks as with the first comparative example.

The phase adjuster circuit 108 (see FIG. 13) which generates the sampling clock is the same circuit as with the phase adjuster circuit 27 (see FIG. 4) of the CDR circuit 20 according to the second comparative example which performs 1x type operations.

That is to say, the CDR circuit 100 according to the first embodiment may increase the sampling rate without increasing the number of clocks.

Also, the phase adjuster circuit 108 (see FIG. 13) is small in scale as with the case of the phase adjuster circuit 27 (see FIG. 4) of the CDR circuit 20 according to the second comparative example which performs 1x type operations, so power consumption is low as well.

Accordingly, power conservation and reduction in circuit scale may be realized.

Note that while description has been made so far regarding a form where the phase adjuster circuit 108 does not include the phase compensation circuit 13 as with the phase adjuster circuit 7 of the first comparative example, the phase adjuster circuit 108 may include a phase compensation circuit in the event that phase compensation is preferable due to reasons such as handling high-speed frequencies, and so forth.

Also, while description has been made so far regarding a form where the DFE 104 is connected to the output side of the integration circuit 102, a comparator circuit similar to the comparator circuit 105 may be connected instead of the DFE 104. Also, a DFE may be connected to the output side of the sampling circuit 103 instead of the comparator circuit 105.

Figure 15:
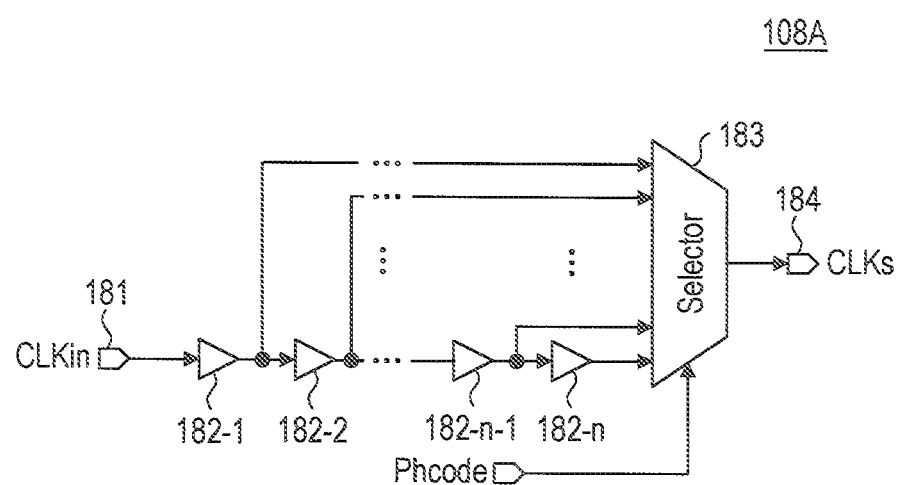
FIG. 15 is a diagram illustrating the circuit configuration of the phase adjuster circuit of the CDR circuit according to a modification of the first embodiment.

Also, the phase adjuster circuit 108 is not restricted to a circuit of the configuration illustrated in FIG. 13, and may a circuit of another format as long as the phase of the reference clock CLKin may be adjusted, such as the circuit illustrated in FIG. 15 for example.

FIG. 15 is a diagram illustrating the circuit configuration of a phase adjuster circuit 108A according to a modification of the first embodiment.

The phase adjuster circuit 108A includes a code input terminal 181, buffers 182-1 through 182-n, a selector 183, and an output terminal 184.

The code input terminal 181 is a terminal where the reference clock CLKin is input from a PLL circuit or the like that is not illustrated.

The buffers 182-1 through 182-n are n buffers connected serially, each having the same amount of delay time. Note that n is an optional integer of 2 or greater.

The a selector 183 is connected so as to be input with the output sides of the buffers 182-1 through 182-n, with the phase code Phcode input from the filter 107 being input to the selection signal input terminal as a selection signal.

The selector 183 selects and outputs the output of one buffer identified by the phase code Phcode (one of buffers 182-1 through 182-n). The selector 183 outputs the reference clock CLKin delayed by the buffers from the buffer 182-1 up to the buffer identified from the phase code Phcode (i.e., one of the buffers 182-2 through 182-n) as the sampling clock CLKs.

The output terminal 184 outputs the sampling clock CLKs output from the selector 183.

Note that by using four of the phase adjuster circuit 108A illustrated in FIG. 15, the sampling clocks CLKs000, CLKs090, CLKs180, and CLKs270 may be output instead of using the phase adjuster circuit 108 illustrated in FIG. 13.

Second Embodiment

Figure 16:
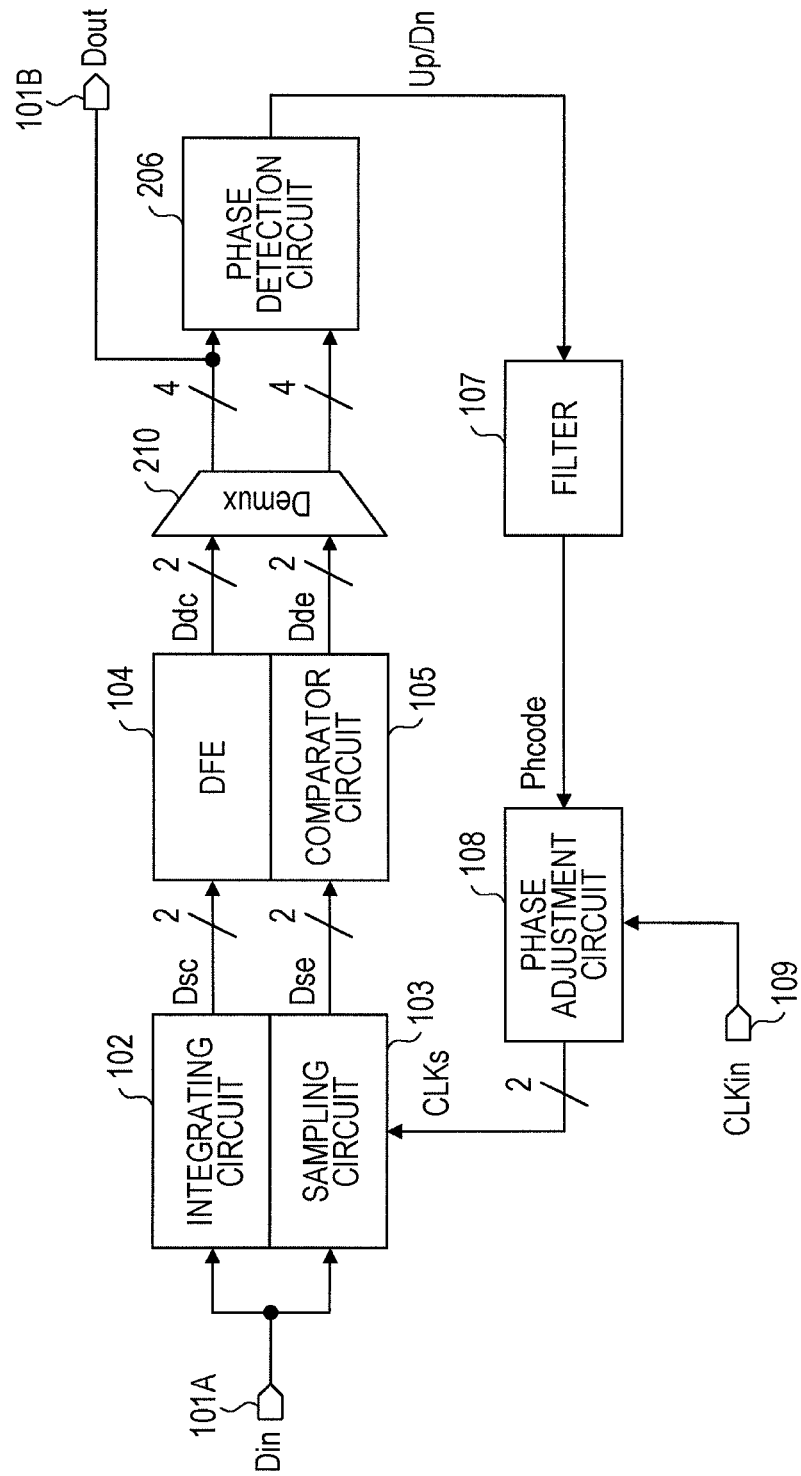
FIG. 16 is a diagram illustrating a CDR circuit according to a second embodiment.

FIG. 16 is a diagram illustrating a CDR circuit 200 according to a second embodiment.

The a CDR circuit 200 according to the second embodiment includes a data input terminal 101A, a data output terminal 1016, integration circuit 102, sampling circuit 103, DFE 104, comparator circuit 105, demultiplexer 210, phase detection circuit 206, filter 107, phase adjuster circuit 108, and clock input terminal 109.

The CDR circuit 200 differs from the CDR circuit 100 with regard to the point of including the demultiplexer 210, and the point of including the phase detection circuit 206 instead of the phase detection circuit 106. Other configurations are the same as with the case of the CDR circuit 100 according to the first embodiment, so components which are the same as denoted with the same reference numerals, and description thereof will be omitted.

The demultiplexer 210 is connected between the DFE 104 and the comparator circuit 105, and the phase detection circuit 206.

The demultiplexer 210 converts the data Ddc which is two sets of differential data in interleaved format, input from the DFE 104, into half-frequency data Ddc, and outputs as four sets of differential data (Ddc) in interleaved format.

Also, the demultiplexer 210 converts the data Dde which is two sets of differential data in interleaved format, input from the comparator circuit 105, into half-frequency data Ddc, and outputs as four sets of differential data (Dde) in interleaved format.

The phase detection circuit 206 detects the phase of the received data Din from the data Ddc and Dde input from the demultiplexer 210, and outputs a down signal Dn to delay the phase in the event that the phase of the sampling clock CLKs is ahead of the received data Din, and outputs an up signal Up to advance the phase in the event that the phase of the sampling clock CLKs is behind the received data Din.

Next, the circuit configuration of the phase detection circuit 206 of the CDR circuit 200 according to the second embodiment will be described with reference to FIG. 17.

Figure 17:
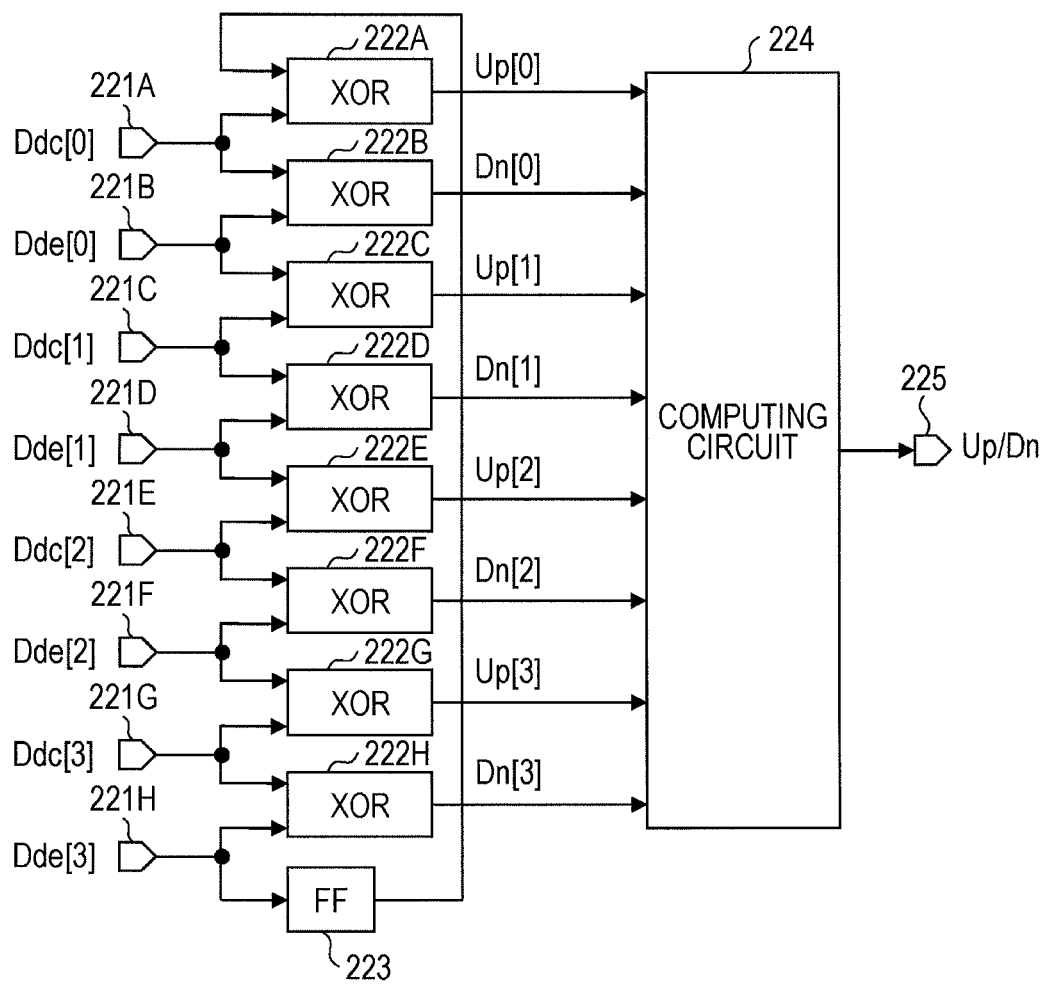
FIG. 17 is a diagram illustrating a phase detection circuit of the CDR circuit according to the second embodiment.

FIG. 17 is a diagram illustrating the phase detection circuit 206 of the CDR circuit 200 according to the second embodiment.

The phase detection circuit 206 includes data input terminals 221A through 221H, XOR circuits 222A through 222H, a flip-flop 223, a computing unit 224, and an output terminal 225.

The data input terminals 221A through 221H are connected to the output terminal of the demultiplexer 210, and are input with data Ddc[0], Dde[0], Ddc[1], Dde[1], Ddc[2], Dde[2], Ddc[3], and Dde[3], respectively.

The output side of the data input terminal 221A is connected to one input terminal of the XOR circuit 222A and one input terminal of the XOR circuit 222B. The output side of the data input terminal 221B is connected to the other input terminal of the XOR circuit 222B and one input terminal of the XOR circuit 222C.

The output side of the data input terminal 221C is connected to the other input terminal of the XOR circuit 222C and one input terminal of the XOR circuit 222D. The output side of the data input terminal 221D is connected to the other input terminal of the XOR circuit 222D and one input terminal of the XOR circuit 222E.

The output side of the data input terminal 221E is connected to the other input terminal of the XOR circuit 222E and one input terminal of the XOR circuit 222F. The output side of the data input terminal 221F is connected to the other input terminal of the XOR circuit 222F and one input terminal of the XOR circuit 222G.

The output side of the data input terminal 221G is connected to the other input terminal of the XOR circuit 222G and one input terminal of the XOR circuit 222H. The output side of the data input terminal 221H is connected to the other input terminal of the XOR circuit 222H and the input terminal of the flip-flop 223.

The XOR circuit 222A has the pair of inter terminals connected to the output terminal of the flip-flop 223 and the data input terminal 221A, and the output terminal is connected to the input terminal of the computing unit 224. The XOR circuit 222B has the pair of inter terminals connected to the data input terminal 221A and the data input terminal 221B, and the output terminal is connected to the input terminal of the computing unit 224.

The XOR circuit 222C has the pair of inter terminals connected to the data input terminal 221B and the data input terminal 221C, and the output terminal is connected to the input terminal of the computing unit 224. The XOR circuit 222D has the pair of inter terminals connected to the data input terminal 221C and the data input terminal 221D, and the output terminal is connected to the input terminal of the computing unit 224.

The XOR circuit 222E has the pair of inter terminals connected to the data input terminal 221D and the data input terminal 221E, and the output terminal is connected to the input terminal of the computing unit 224. The XOR circuit 222F has the pair of input terminals connected to the data input terminal 221E and the data input terminal 221F, and the output terminal is connected to the input terminal of the computing unit 224. The XOR circuit 222G has the pair of inter terminals connected to the data input terminal 221F and the data input terminal 221G, and the output terminal is connected to the input terminal of the computing unit 224.

The XOR circuit 222H has the pair of inter terminals connected to the data input terminal 221G and the data input terminal 221H, and the output terminal is connected to the input terminal of the computing unit 224.

The flip-flop 223 has the input terminal connected to the data input terminal 221H, and the output terminal is connected to the other input terminal of the XOR circuit 222A.

The computing unit 224 has the input side connected to the XOR circuits 222A through 222H, and the output side is connected to the output terminal 225.

The output terminal 225 is connected to the output side of the computing unit 224.

The XOR circuit 222A outputs a signal representing the XOR of the output from the flip-flop 223 and the data input from the data input terminal 221A as an up signal Up[0]. The XOR circuit 222B outputs a signal representing the XOR of the data input to the data input terminal 221A and the data input to the data input terminal 221B as a down signal Dn[0].

The XOR circuit 222C outputs a signal representing the XOR of the input to the data input terminal 221B and the data input to the data input terminal 221C as an up signal Up[1]. The XOR circuit 222D outputs a signal representing the XOR of the data input to the data input terminal 221C and the data input to the data input terminal 221D as a down signal Dn[1].

The XOR circuit 222E outputs a signal representing the XOR of the input to the data input terminal 221D and the data input to the data input terminal 221E as an up signal Up[2]. The XOR circuit 222F outputs a signal representing the XOR of the data input to the data input terminal 221E and the data input to the data input terminal 221F as a down signal Dn[2].

The XOR circuit 222G outputs a signal representing the XOR of the input to the data input terminal 221F and the data input to the data input terminal 221G as an up signal Up[3]. The XOR circuit 222H outputs a signal representing the XOR of the data input to the data input terminal 221G and the data input to the data input terminal 221H as a down signal Dn[2].

The computing unit 224 decides the degree of up signals Up or down signals Dn ultimately output from the output terminal 225 as the operation of the phase detection circuit 206 data input terminal data input terminal, based on average values of the up signal Up and down signal Dn input from the XOR circuits 222A through 222H, for example.

The CDR circuit 200 according to the second embodiment including the demultiplexer 210 and phase detection circuit 206 as described above may be operated as a 2x type where sampling is performed twice as to each bit of received data Din, in the same way as with the CDR circuit 100 according to the first embodiment.

At this time, four sets of differential clocks do not have to be used as with the first comparative example; rather, it is sufficient to use two sets of differential clocks as with the case of the CDR circuit 20 in the second comparative example.

Accordingly, the CDR circuit 200 according to the second embodiment may increase the sampling rate without increasing the number of clocks.

Also, the phase adjuster circuit 108 (see FIG. 13) is small in scale as with the case of the phase adjuster circuit 27 (see FIG. 4) which performs 1x type operations, so power consumption is low as well. Accordingly, power conservation and reduction in circuit scale may be realized.

Also, with the CDR circuit 200 according to the second embodiment, the frequency of the output data Dout output from the data output terminal 1016 may be half the frequency of the output data Dout output from the data output terminal 101B of the CDR circuit 100 according to the first embodiment.

Third Embodiment

Figure 18:
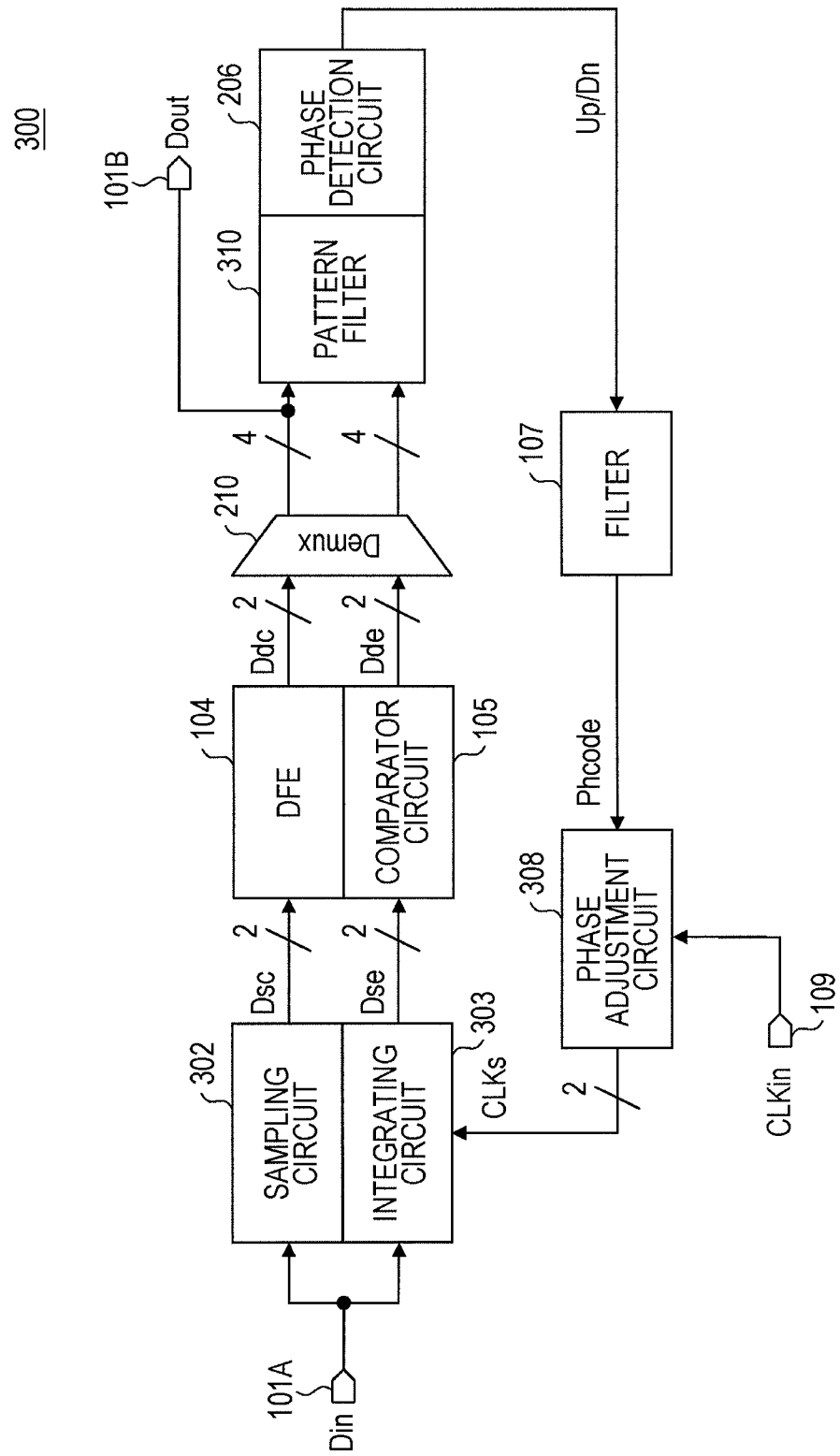
FIG. 18 is a diagram illustrating a CDR circuit according to a third embodiment.

FIG. 18 is a diagram illustrating a CDR circuit 300 according to a third embodiment.

The a CDR circuit 300 according to the third embodiment includes the data input terminal 101A, data output terminal 101B, a sampling circuit 302, an integration circuit 303, DFE 104, comparator circuit 105, demultiplexer 210, pattern filter 310, phase detection circuit 206, filter 107, phase adjuster circuit 308, and clock input terminal 109.

The CDR circuit 300 according to the third embodiment differs from the CDR circuit 200 according to the second embodiment in that it detects the data center of the received data Din with the sampling circuit 302, and detects the data edge of the received data Din with the integration circuit 303.

The CDR circuit 300 according to the third embodiment also differs from the CDR circuit 200 according to the second embodiment with regard to the point of including the pattern filter 310 between the demultiplexer 210 and the phase detection circuit 206.

Also, the phase adjuster circuit 308 according to the third embodiment differs from the phase adjuster circuit 108 according to the first embodiment regarding the point that the phase of the sampling clock CLKs is adjusted so as to track the data center of the received data Din.

Other configurations are the same as with the case of the CDR circuit 200 according to the second embodiment, so components which are the same as denoted with the same reference numerals, and description thereof will be omitted.

The sampling circuit 302 has the same circuit configuration as with the sampling circuits 103 in the first and second embodiments. The sampling circuit 302 is connected between the data input terminal 101A and the DFE 104. The sampling circuit 302 samples the data center value Dsc of the received data Din input via the data input terminal 101A and outputs, based on the sampling clock CLKs.

The output of the sampling circuit 302 is equalized at the DFE 104, so even in the event that there is loss in the signal level of the data in the received data Din, the received data Din may be received with the same capability as with the sampling circuit 2A of the CDR circuit 10 according to the first comparative example.

The integration circuit 303 has the same circuit configuration as with the integration circuit 102 of the first and second embodiments. The integration circuit 303 is connected between the data input terminal 101A and comparator circuit 105. The integration circuit 303 integrates and outputs the data edge value Dse of the received data Din input via the data input terminal 101A, based on the sampling clock CLKs.

Thus, with the CDR circuit 300 according to the third embodiment, the sampling circuit 302 samples the data center value of the received data Din, so the timing of the leading edge of the sampling clock CLKs is phase-adjusted by the phase adjuster circuit 308 so as to match the data center of the received data Din.

The pattern filter 310 detects the pattern of data included in the output of the demultiplexer 210. The pattern filter 310 is provided at the input side of the phase detection circuit 206 to reduce irregularities in amplitude properties due to the integration circuit 303 which integrates the data edge of the received data Din, and deterioration in phase tracking precision, from occurring. The pattern filter 310 masks (filters) patterns where the received data Din is high frequency, such as 0101 for example, and detects the phase of the received data Din of other data patterns.

Now, integration of the data edge value Dse of the received data Din by the integration circuit 303 will be described with reference to FIG. 19.

Figure 19:
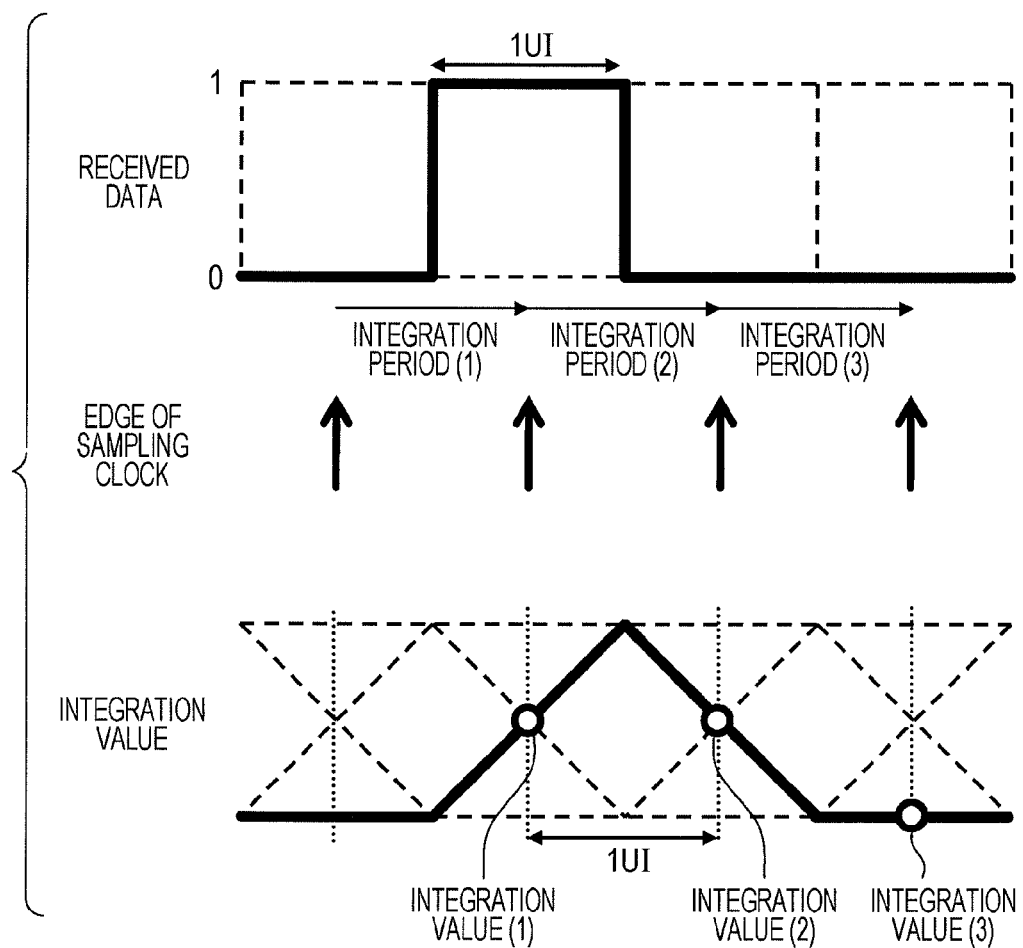
FIG. 19 is a diagram schematically illustrating the relation between reception data, sampling clock edge, and integration value, at the time of an integration circuit of the integration circuit CDR circuit according to the third embodiment integrating data edge values of received data.

FIG. 19 is a diagram schematically illustrating the relation between the received data, edge of sampling clock, and integration value, at the time of the integration circuit 303 of the CDR circuit 300 according to the third embodiment integrating the data edge values of the received data Din.

For example, we will say that received data Din of 0, 1, 0, 0 is input to the integration circuit 303, as indicated by the solid lines in FIG. 19. 1 UI represents a unit interval of the received data Din.

With the third embodiment, the timing of the edge (leading edge) of the sampling clock CLKs is adjusted by the phase adjuster circuit 108 so as to match the data center of the received data Din.

Accordingly, performing integration over integration periods (1) through (3) between the edges of the sampling clock CLKs with 1 UI as the integration period, the integration value at the integration period (2) where the received data straddles 1 and 0 is the data edge value (intermediate value of 1 and 0) of 1 UI.

Note that while FIG. 19 illustrates a case where the integration period is the same as the length of one data cycle of the received data, in the case of the integration circuit 303 integrating the data edge values of the received data Din as with the third embodiment, it is sufficient for the integration period of the integration circuit 303 to be equal to a multiple of one cycle of the received data Din.

That is to say, the integration period is not restricted to 1 UI, and may be a period which is a multiple of 1 UI. In the event of integrating the data edge of the received data Din, performing integration over a period defined as multiple UIs still yields data edge integration values.

FIG. 19 illustrates the integration values overlaid on the eye pattern of the received data Din, but the integration values are obtained as data center values of 1 UI of the received data Din.

With the third embodiment, the data edge value of the received data Din is integrated at the integration circuit 303, as illustrated in FIG. 19.

The CDR circuit 300 according to the third embodiment such as described above may be operated as a 2x type where sampling is performed twice as to each bit of received data Din, in the same way as with the CDR circuits 100 and 200 according to the first and second embodiments.

At this time, four sets of differential clocks do not have to be used as with the first comparative example; rather, it is sufficient to use two sets of differential clocks as with the case of the CDR circuit 20 in the second comparative example.

Accordingly, the CDR circuit 300 according to the third embodiment may increase the sampling rate without increasing the number of clocks.

Also, the phase adjuster circuit 108 (see FIG. 13) is small in scale as with the case of the phase adjuster circuit 27 (see FIG. 4) which performs 1x type operations, so power consumption is low as well. Accordingly, power conservation and reduction in circuit scale may be realized.

Also, with the CDR circuit 300 according to the third embodiment, the frequency of the output data Dout output from the data output terminal 1016 may be half the frequency of the output data Dout output from the data input terminal 101B of the CDR circuit 100 according to the first embodiment.

The following is a note for the embodiments.

Note 1. An apparatus comprising an integration circuit to integrate a waveform of data as a data center value, based on a clock signal; a sampling circuit to sample an edge portion of the waveform of the data as an edge value, based on the clock signal; a first determination circuit to determine whether the data center value is greater than a first threshold value; a second determination circuit to determine whether the edge value is greater than a second threshold value; a phase detection circuit to detect phase information of the data, based on results determined by the first determination circuit and the second determination circuit; and a phase adjusting circuit to adjust a phase of the clock signal so as to track a phase of the data, in accordance with the phase information.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus, comprising:
an integration circuit that integrates values between a start edge and an end edge of input data and outputs an integration value at timing of the end edge as a data center value, based on a first clock signal or that integrates values between a data center and a next data center for a unit interval of the input data and outputs an integration value at timing of the data center as an edge value, based on a second clock signal;
a sampling circuit that samples a value of a data edge of the input data, based on the first clock signal or a value of the data center, based on the second clock signal;
a first determination circuit that determines a data value using the integration value of the integration circuit;
a second determination circuit that determines a data value using the sampling value of the sampling circuit;
a phase detection circuit that detects phase information of the input data, based on a data value determined by the first determination circuit and the second determination circuit; and
a phase adjusting circuit that adjusts a phase of a reference clock so as to track a phase of the input data, in accordance with the phase information, so as to output as the first clock signal or the second clock signal.

2. The apparatus according to claim 1;
wherein the first determination circuit and the second determination circuit are a decision feedback equalizer circuit.

3. The apparatus according to claim 1;
wherein, in a case of the integration circuit integrating values of the data center of the input data, an integration period of the integration circuit is a length of one cycle of the input data.

4. The apparatus according to claim 1;
wherein, in a case of the integration circuit integrating values of the data edge of the input data, an integration period of the integration circuit is a length of a multiple of one cycle of the input data.

5. The apparatus according to claim 1;
wherein a plurality of sets of the integration circuit and the sampling circuit are included, and each of the first clock signal and the second clock signal is an interleaved format clock signal;
and wherein each set of the integration circuit and the sampling circuit outputs integration values and sampling values in interleaved format, based on the interleaved format clocks.

6. The apparatus according to claim 1, further comprising:
a pattern filter, disposed between the first determination circuit and second determination circuit, and the phase detection circuit.

7. An apparatus, comprising:
an integration circuit that integrates values between a start edge and an end edge of a waveform for a unit interval of input data and outputs a data center value at timing of the end edge, based on a clock signal;
a sampling circuit that samples an edge portion of the waveform of the data as an edge value, based on the clock signal;
a first determination circuit that determines whether the data center value is greater than a first threshold value;
a second determination circuit that determines whether the edge value is greater than a second threshold value;
a phase detection circuit that detects phase information of the data, based on results determined by the first determination circuit and the second determination circuit; and
a phase adjusting circuit that adjusts a phase of the clock signal so as to track a phase of the data, in accordance with the phase information.

* * * * *